United States Patent
Shintani et al.

(10) Patent No.: US 10,080,313 B2
(45) Date of Patent: Sep. 18, 2018

(54) POWER MODULE AND METHOD FOR MANUFACTURING THE SAME

(71) Applicant: Hitachi, Ltd., Tokyo (JP)

(72) Inventors: Hiroshi Shintani, Tokyo (JP); Eiichi Ide, Tokyo (JP); Koji Sasaki, Tokyo (JP); Hisashi Tanie, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 59 days.

(21) Appl. No.: 15/104,587

(22) PCT Filed: Jan. 27, 2014

(86) PCT No.: PCT/JP2014/051643
§ 371 (c)(1),
(2) Date: Jun. 15, 2016

(87) PCT Pub. No.: WO2015/111211
PCT Pub. Date: Jul. 30, 2015

(65) Prior Publication Data
US 2016/0322281 A1    Nov. 3, 2016

(51) Int. Cl.
*H05K 7/20* (2006.01)
*H01L 23/473* (2006.01)
(Continued)

(52) U.S. Cl.
CPC ..... *H05K 7/20927* (2013.01); *H01L 21/4817* (2013.01); *H01L 21/4857* (2013.01);
(Continued)

(58) Field of Classification Search
CPC ... H01L 23/473; H01L 23/043; H01L 25/072; H01L 23/49822; H01L 23/3675;
(Continued)

(56) References Cited

U.S. PATENT DOCUMENTS 8,064,234 B2 * 11/2011 Tokuyama ............ H01L 23/473
    363/132
9,030,823 B2 * 5/2015 Kim ................... H05K 7/20927
    165/104.14
(Continued)

FOREIGN PATENT DOCUMENTS

JP    09-121019 A    5/1997
JP    2005-073342 A    3/2005
(Continued)

OTHER PUBLICATIONS

International Search Report of PCT/JP2014/051643 dated Mar. 25, 2014.

*Primary Examiner* — Zachary M Pape
(74) *Attorney, Agent, or Firm* — Mattingly & Malur, PC

(57) ABSTRACT

A power module or the like is provided in which lower inductance and miniaturization are achieved. The power module includes: main body units (11 to 13), cooling units (21 to 24) which cool the main body units (11 to 13), busbars (51, 52) connected to power terminals (**1*i*, 1*j*) of the main body units (11 to 13), a casing (W) in which at least contact parts with the busbars (51, 52) are insulative, and a metal member (30) which supports the casing (W). The metal member (30) tightly contacts the casing (W), thereby forming a box with one side opened. At least the main body units (11 to 13) and the busbars (51, 52**) are arranged inside the box. An insulating sealant is provided to fill the inside of the box.

14 Claims, 28 Drawing Sheets

(51) Int. Cl.

| | | |
|---|---|---|
| *H01L 23/498* | (2006.01) | |
| *H01L 23/373* | (2006.01) | |
| *H01L 23/40* | (2006.01) | |
| *H01L 25/07* | (2006.01) | |
| *H01L 25/18* | (2006.01) | |
| *H01L 23/00* | (2006.01) | |
| *H01L 21/48* | (2006.01) | |
| *H01L 21/54* | (2006.01) | |
| *H01L 23/043* | (2006.01) | |
| *H01L 23/24* | (2006.01) | |
| *H01L 23/367* | (2006.01) | |
| *H01L 23/433* | (2006.01) | |

(52) U.S. Cl.
CPC ............ *H01L 21/54* (2013.01); *H01L 23/043* (2013.01); *H01L 23/24* (2013.01); *H01L 23/3675* (2013.01); *H01L 23/3735* (2013.01); *H01L 23/4006* (2013.01); *H01L 23/473* (2013.01); *H01L 23/49822* (2013.01); *H01L 23/49838* (2013.01); *H01L 24/33* (2013.01); *H01L 25/07* (2013.01); *H01L 25/072* (2013.01); *H01L 25/18* (2013.01); *H01L 23/4012* (2013.01); *H01L 23/4334* (2013.01); *H01L 2924/13055* (2013.01); *H01L 2924/13091* (2013.01)

(58) Field of Classification Search
CPC ........... H01L 21/4817; H01L 23/49838; H01L 21/4857; H01L 21/54; H01L 23/24; H01L 24/33; H01L 25/07; H01L 25/18; H01L 23/46; H01L 2924/1425; H01L 2924/14251; H01L 2924/14252; H05K 7/2089–7/20927; H05K 7/20218–7/20272; H02P 27/04; H01H 9/52
See application file for complete search history.

(56) References Cited

U.S. PATENT DOCUMENTS

| | | | |
|---|---|---|---|
| 9,497,873 B2* | 11/2016 | Takagi | H02M 7/003 |
| 2006/0119512 A1 | 6/2006 | Yoshimatsu et al. | |
| 2011/0044001 A1* | 2/2011 | Olesen | H01L 23/473 |
| | | | 361/703 |
| 2011/0188204 A1* | 8/2011 | Horiuchi | H01L 23/473 |
| | | | 361/702 |
| 2011/0299265 A1* | 12/2011 | Nakatsu | B60L 11/14 |
| | | | 361/820 |
| 2011/0310585 A1* | 12/2011 | Suwa | H05K 7/1432 |
| | | | 361/820 |
| 2013/0075886 A1* | 3/2013 | Abe | H02M 7/003 |
| | | | 257/685 |
| 2013/0175678 A1* | 7/2013 | Ide | H01L 23/36 |
| | | | 257/675 |
| 2014/0078803 A1* | 3/2014 | Nishihara | H02M 7/003 |
| | | | 363/141 |
| 2014/0118934 A1* | 5/2014 | Tokuyama | H05K 7/1432 |
| | | | 361/689 |
| 2014/0160822 A1* | 6/2014 | Kuwano | H02M 7/003 |
| | | | 363/141 |
| 2015/0016063 A1* | 1/2015 | Higuma | H01L 23/473 |
| | | | 361/714 |
| 2015/0163962 A1* | 6/2015 | Suzuki | H02M 7/003 |
| | | | 361/699 |
| 2015/0223366 A1* | 8/2015 | Horiuchi | H02M 7/003 |
| | | | 361/689 |
| 2015/0256096 A1* | 9/2015 | Nishizawa | H01G 2/04 |
| | | | 363/131 |
| 2015/0305188 A1* | 10/2015 | Maeda | H05K 7/1432 |
| | | | 361/728 |
| 2016/0234976 A1* | 8/2016 | Shimura | H02M 7/003 |

FOREIGN PATENT DOCUMENTS

| | | |
|---|---|---|
| JP | 2006-190972 A | 7/2006 |
| JP | 2010-258315 A | 11/2010 |
| JP | 2011-181687 A | 9/2011 |
| JP | 2012-043915 A | 3/2012 |

* cited by examiner

[FIG. 1]
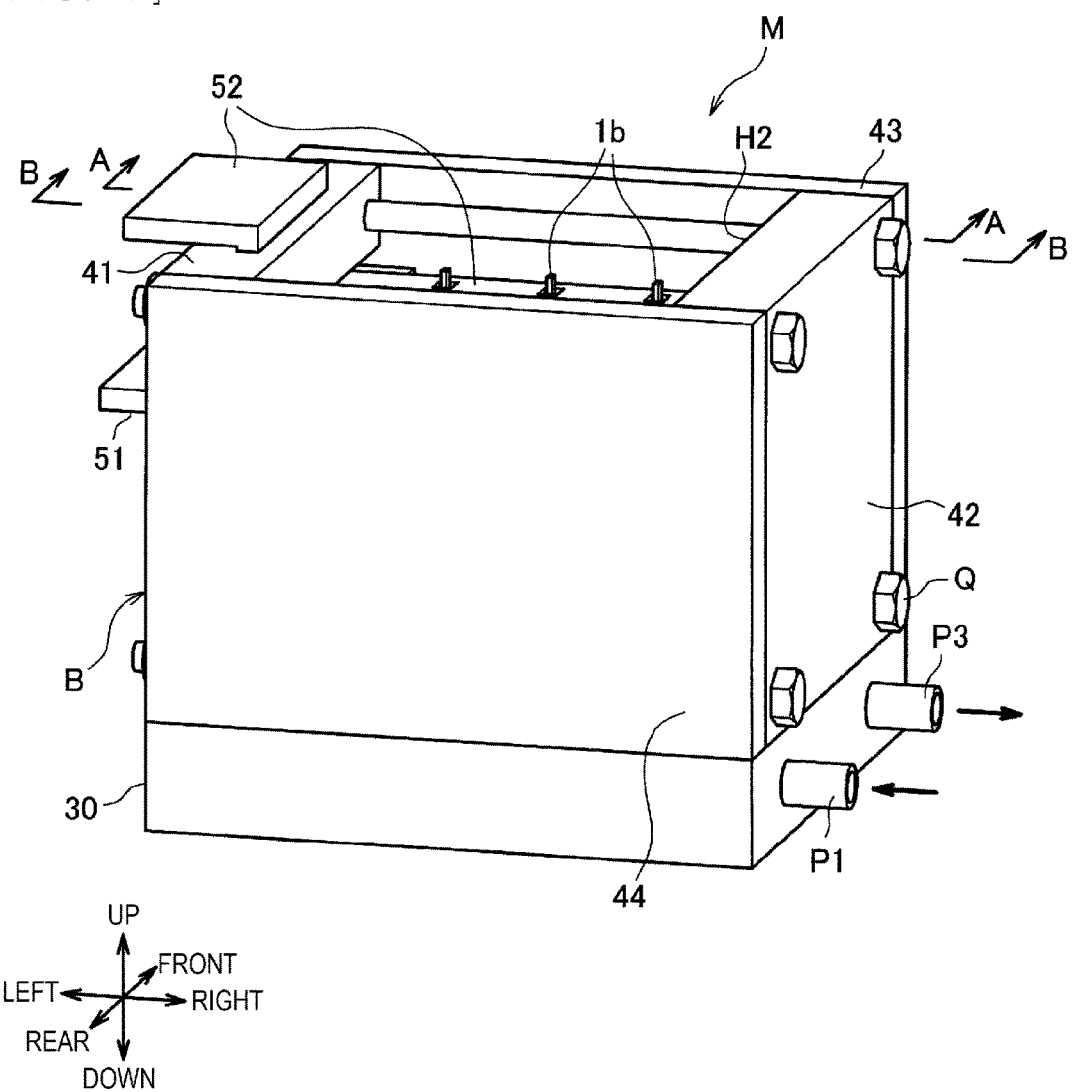

[FIG. 2]
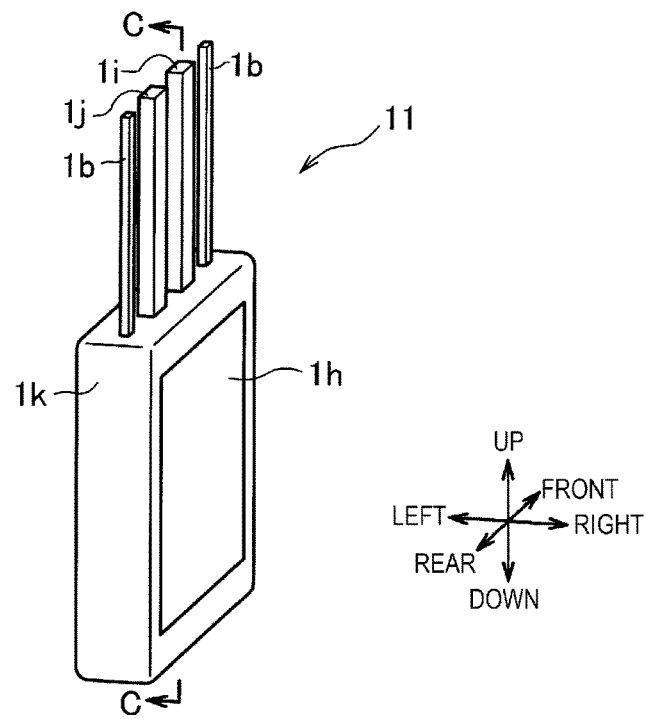
[FIG. 3]
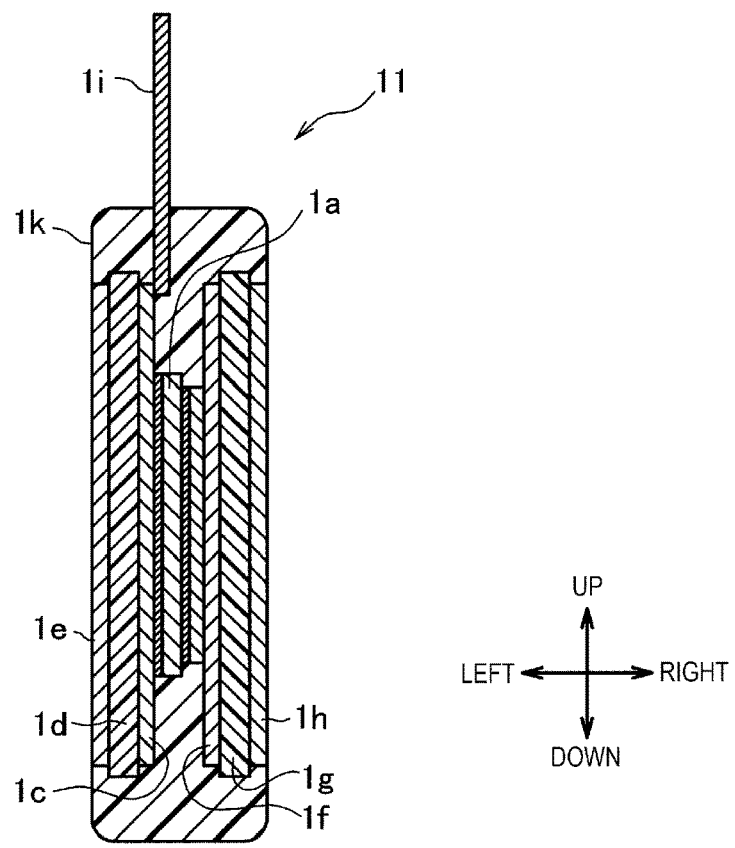

[FIG. 4]
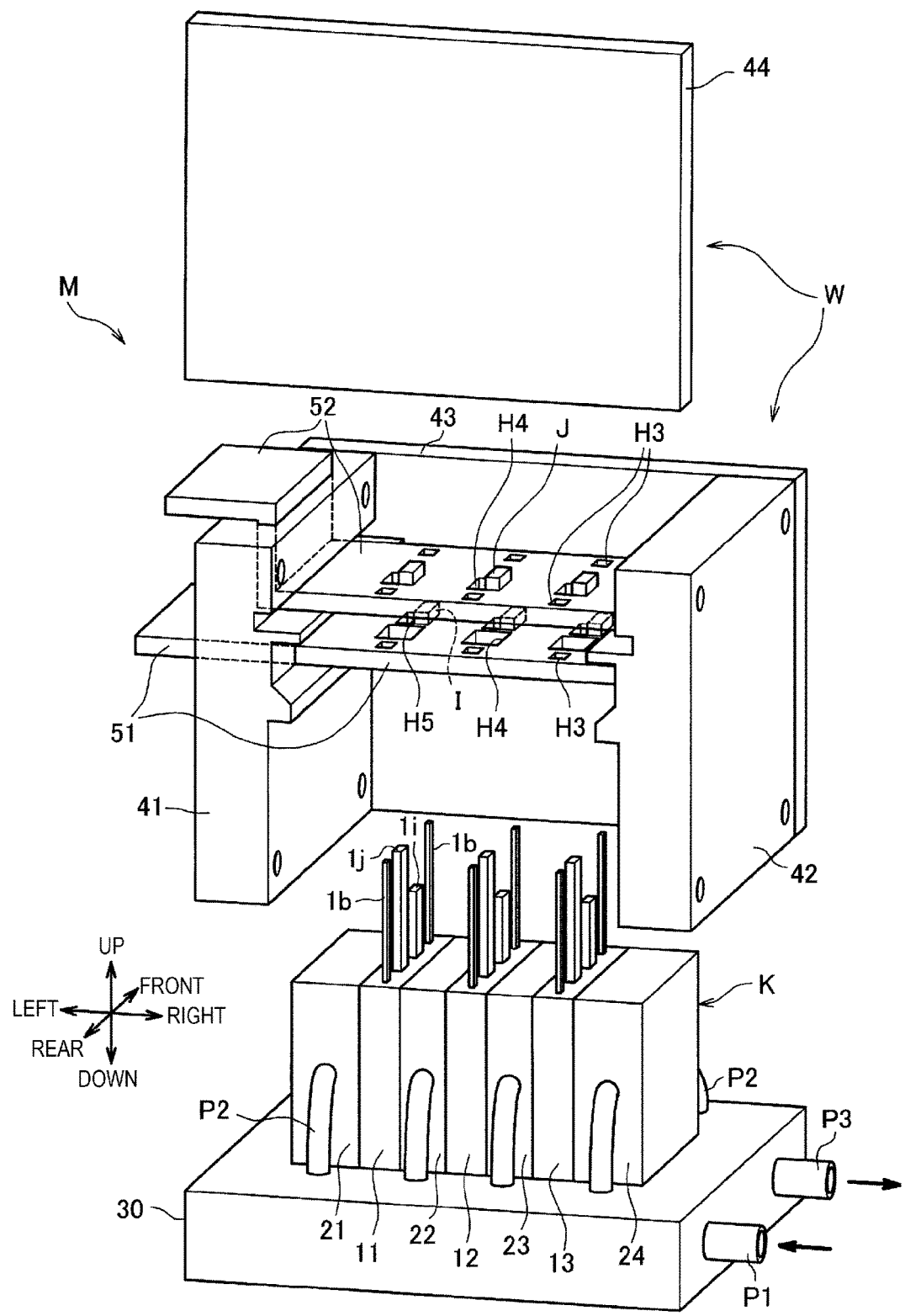

[FIG. 5]
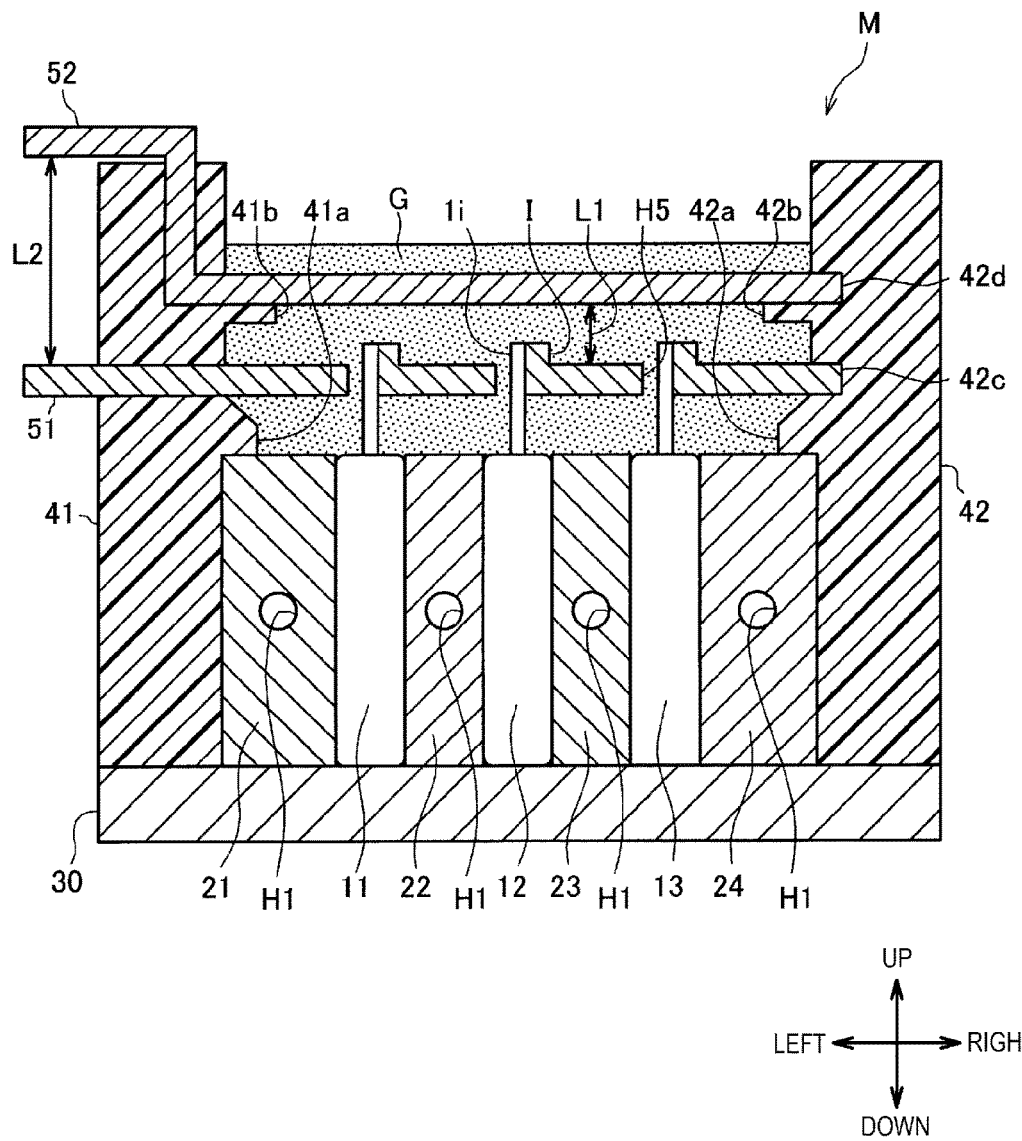

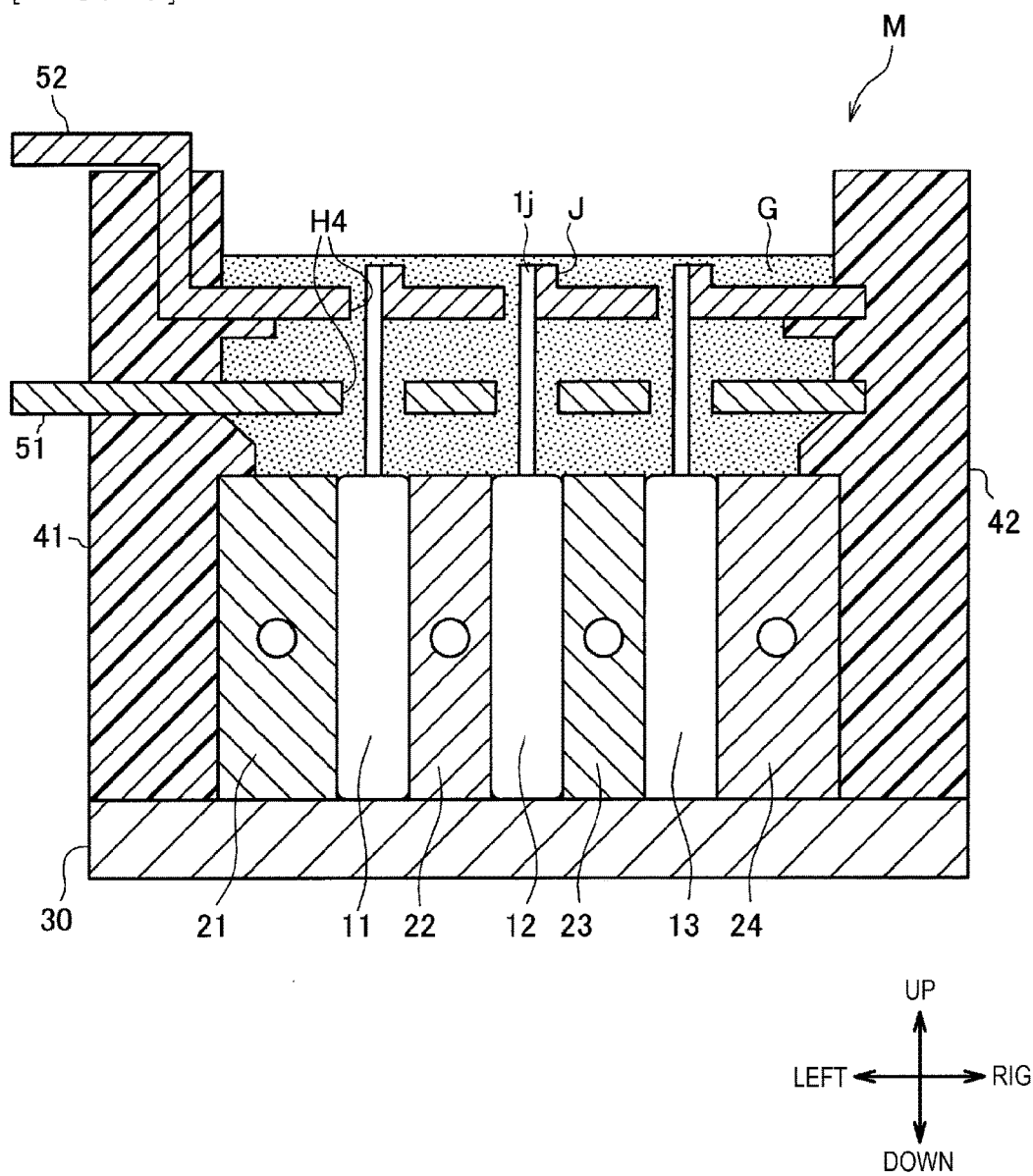
[FIG. 6]

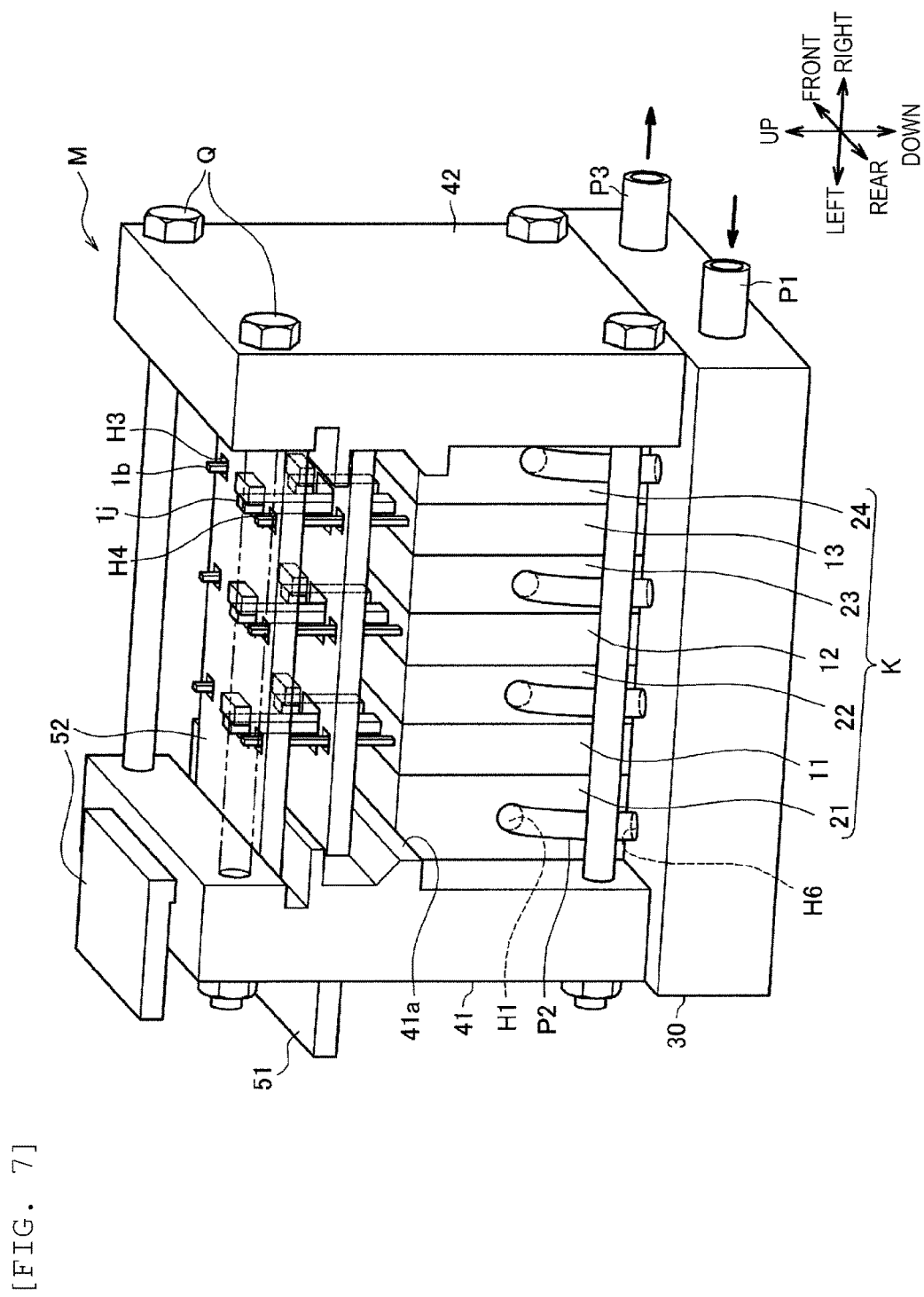
[FIG. 7]

[FIG. 8]
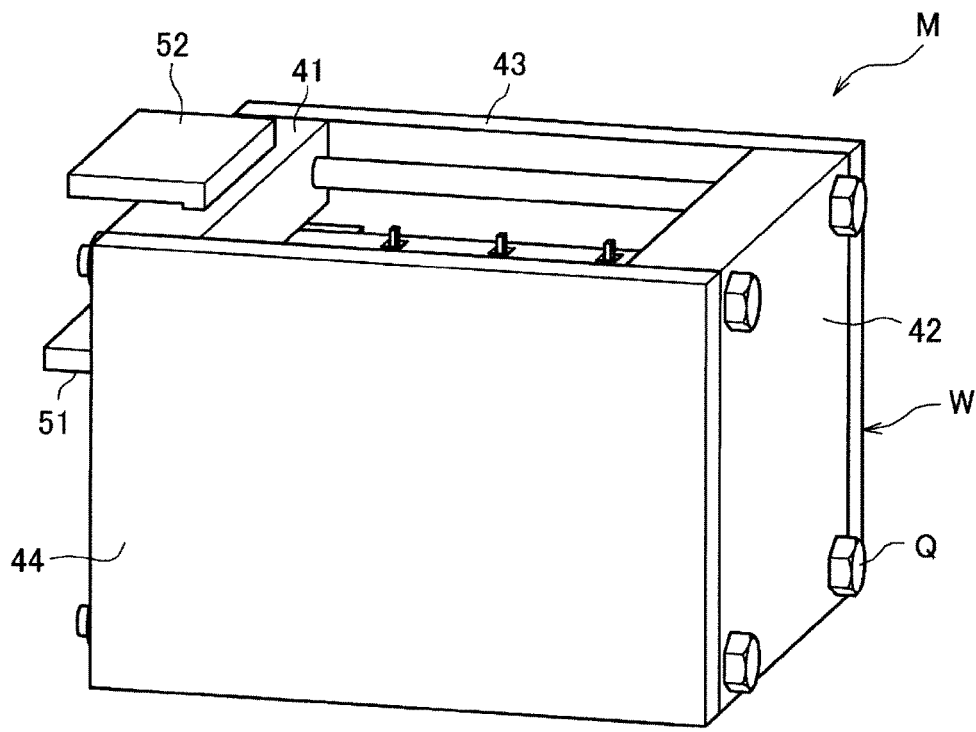
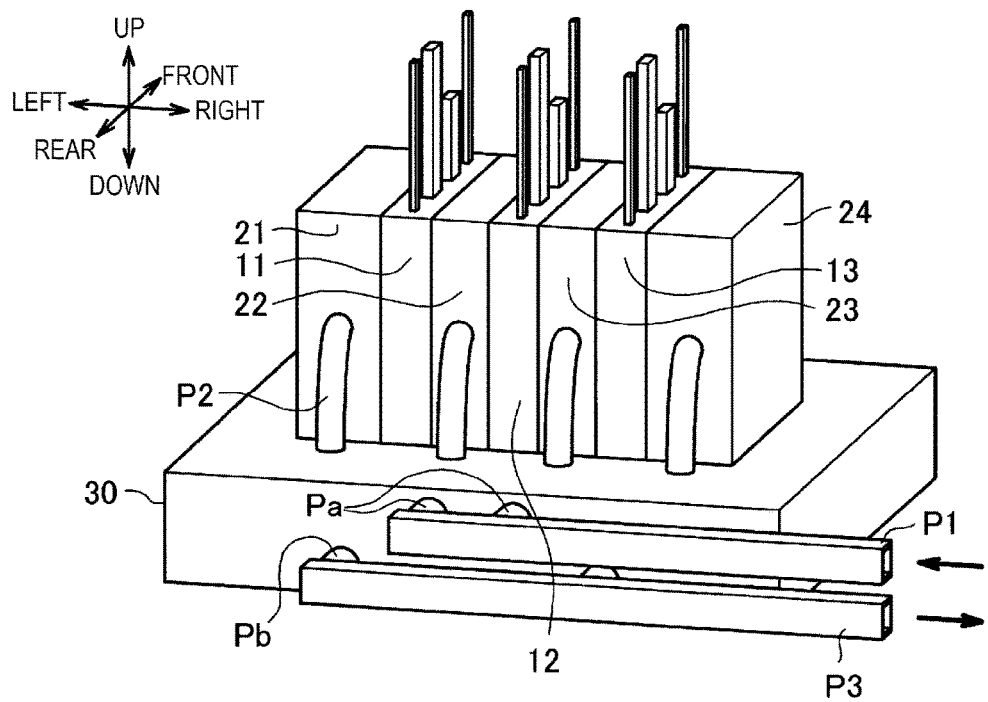

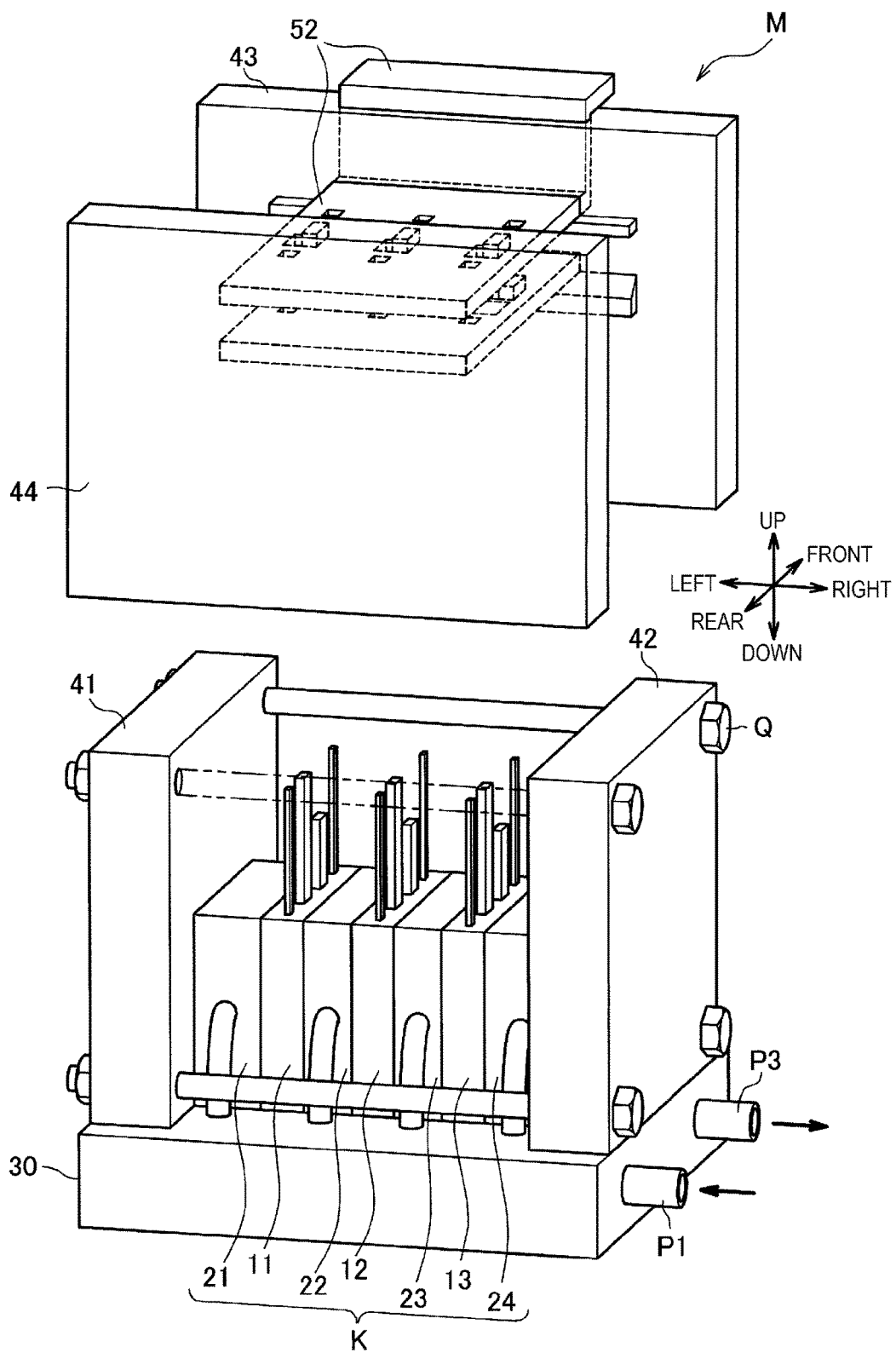
[FIG. 9]

[FIG. 10]
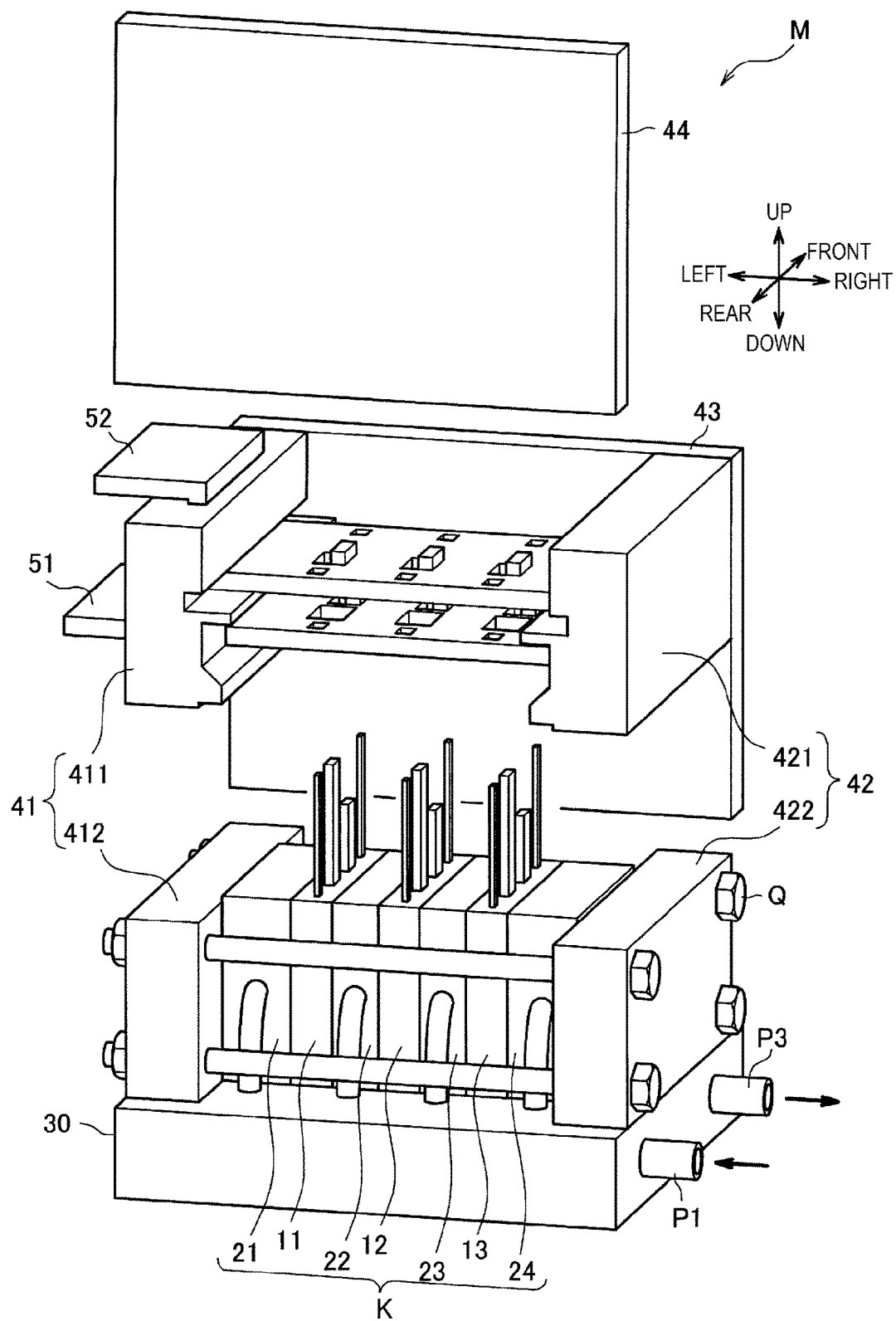

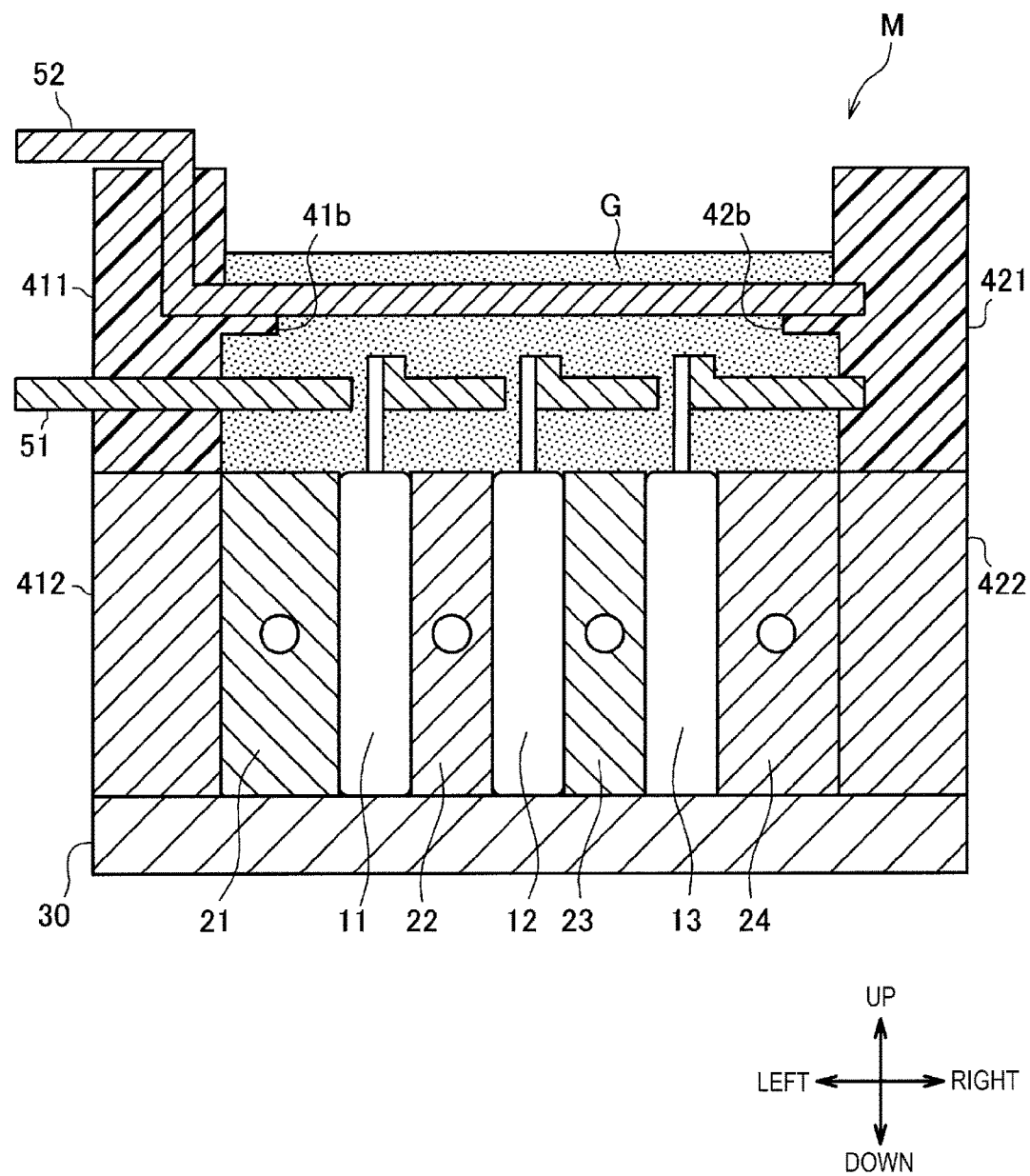
[FIG. 11]

[FIG. 12]
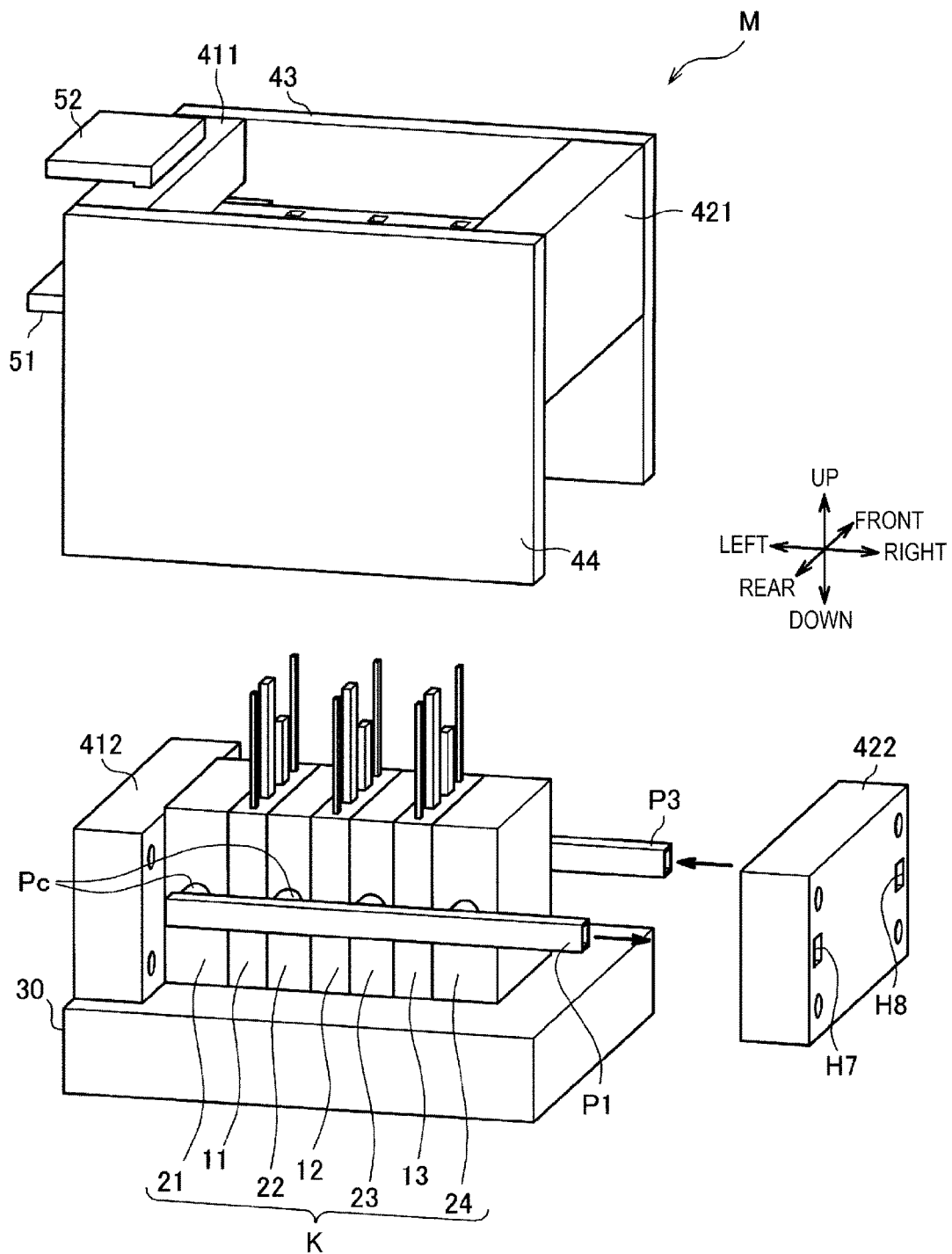

[FIG. 13]
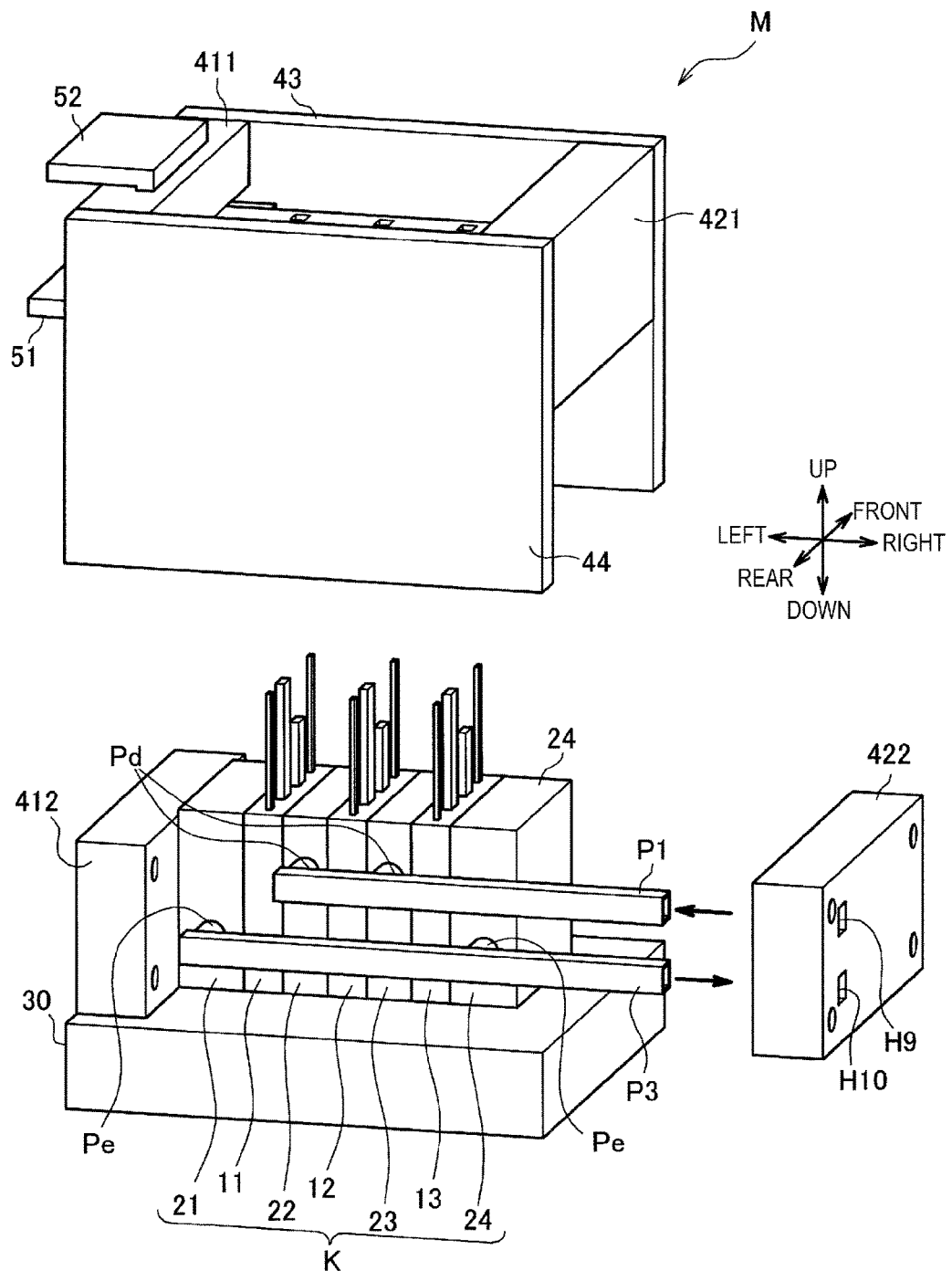

[FIG. 14]
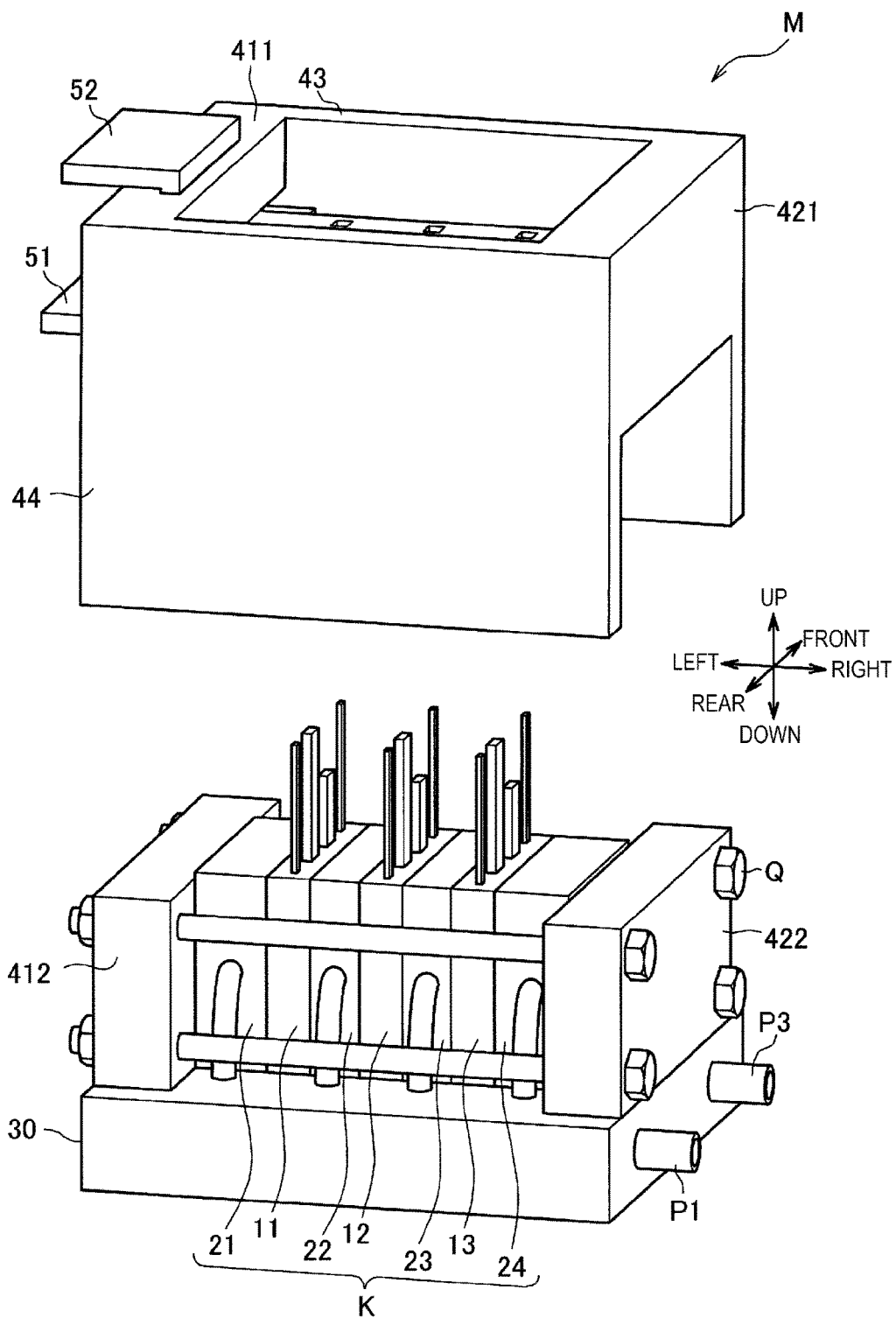

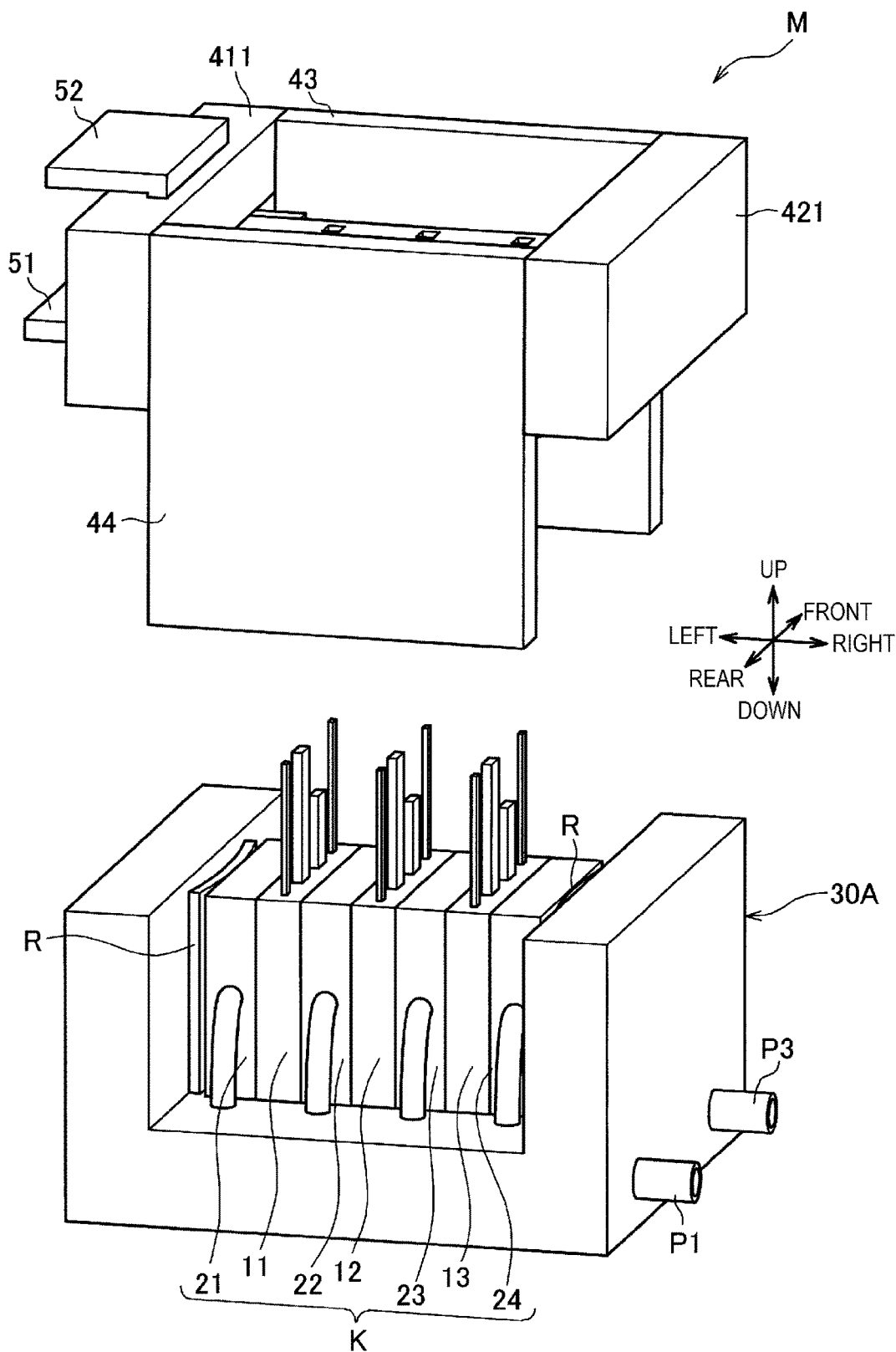
[FIG. 15]

[FIG. 16]
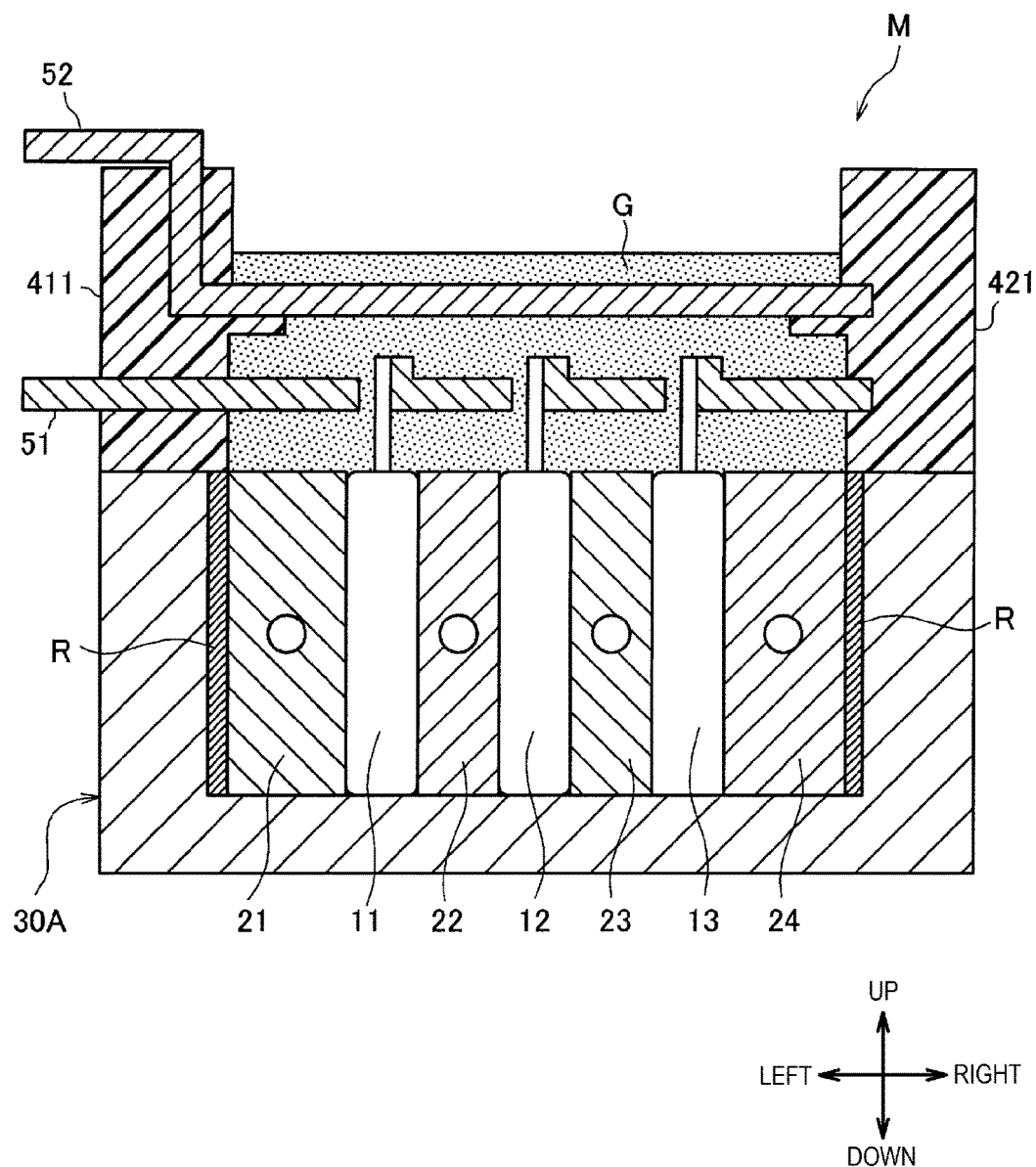

[FIG. 17]
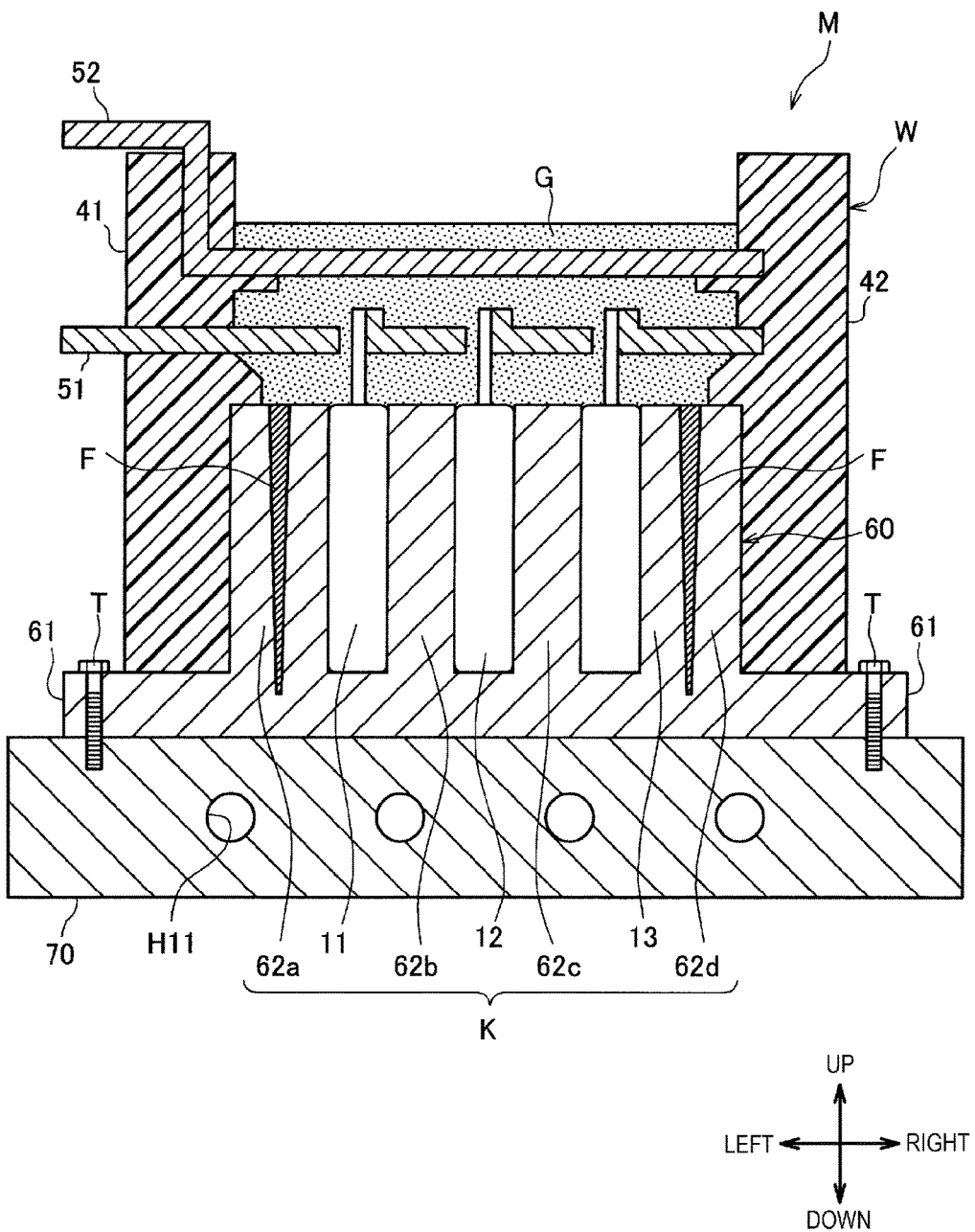

[FIG. 18]
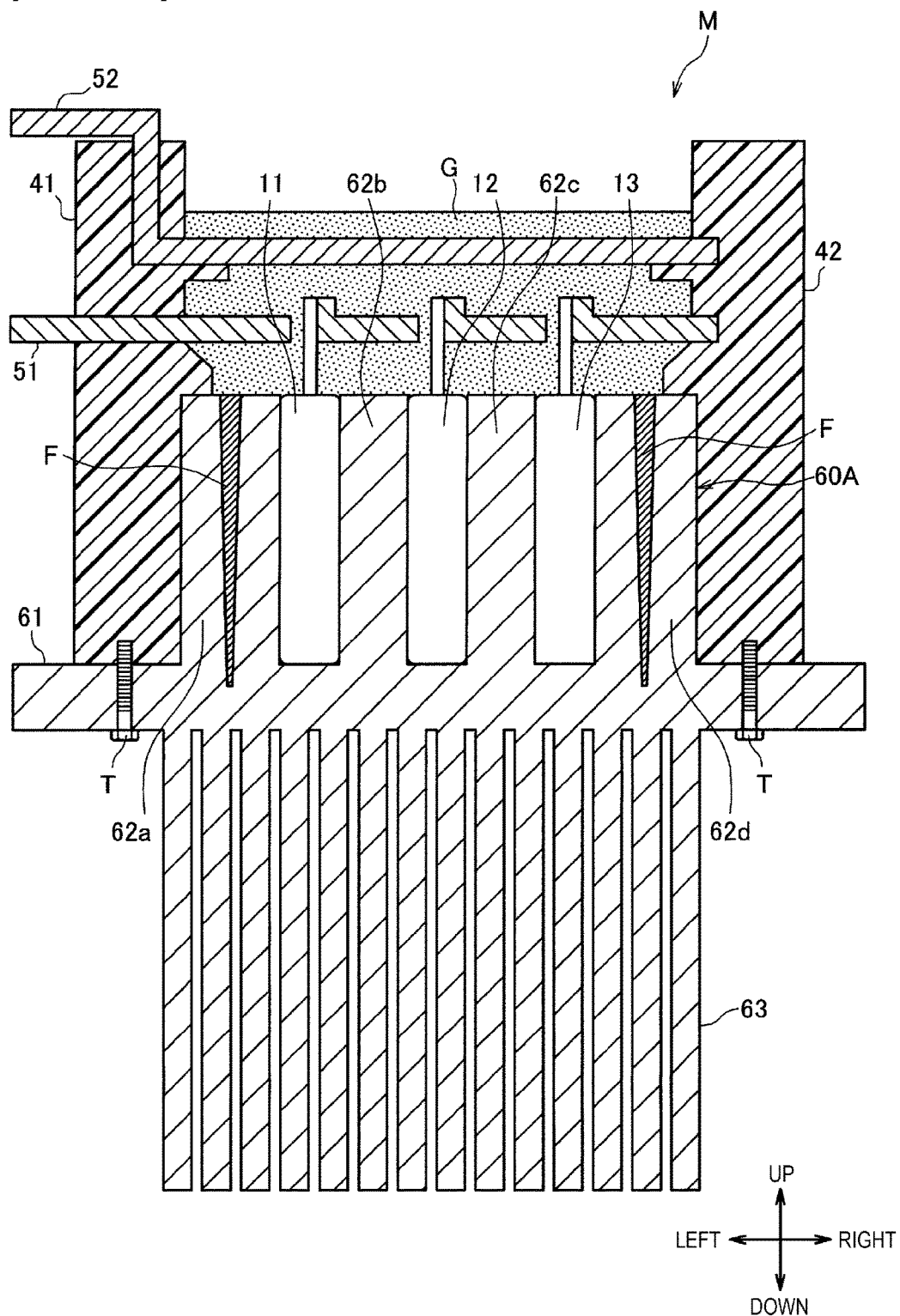

[FIG. 19]
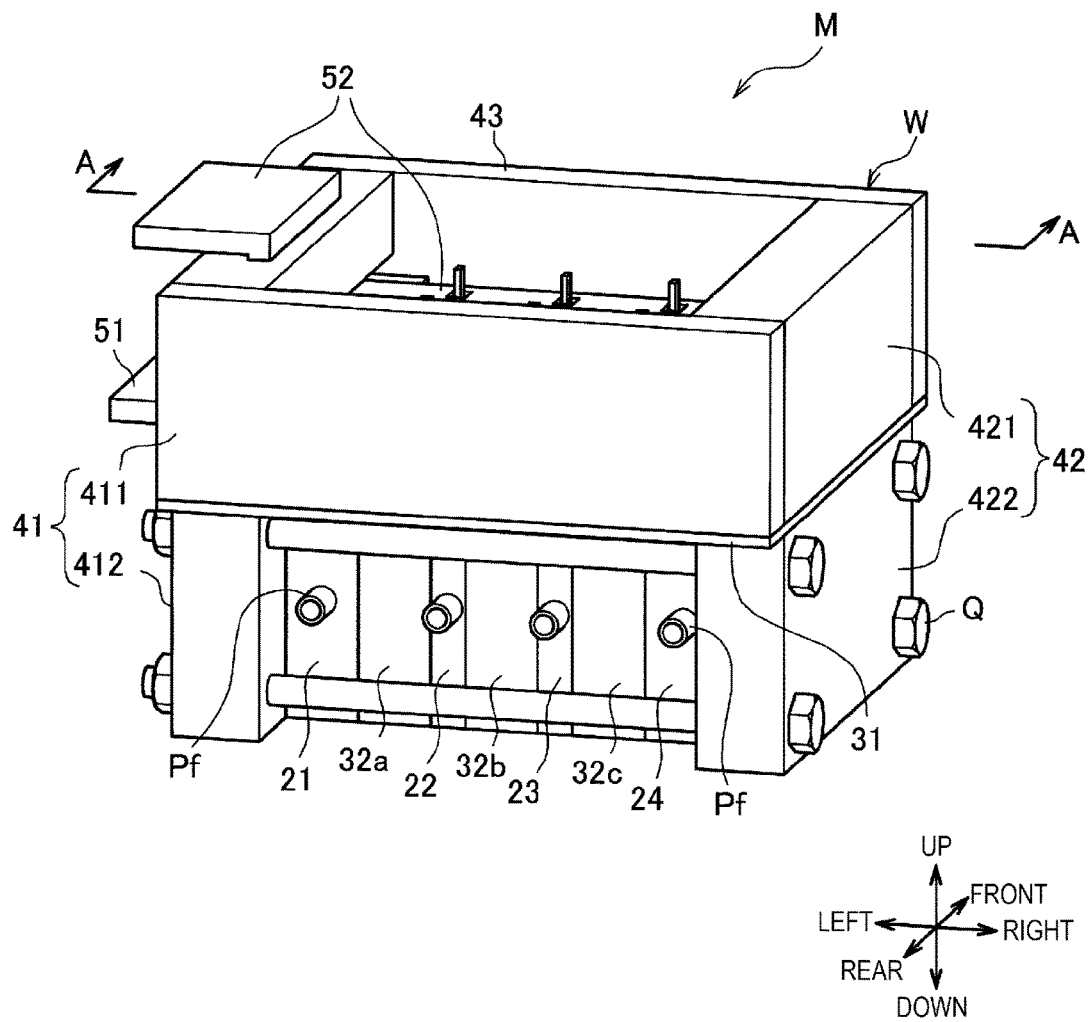

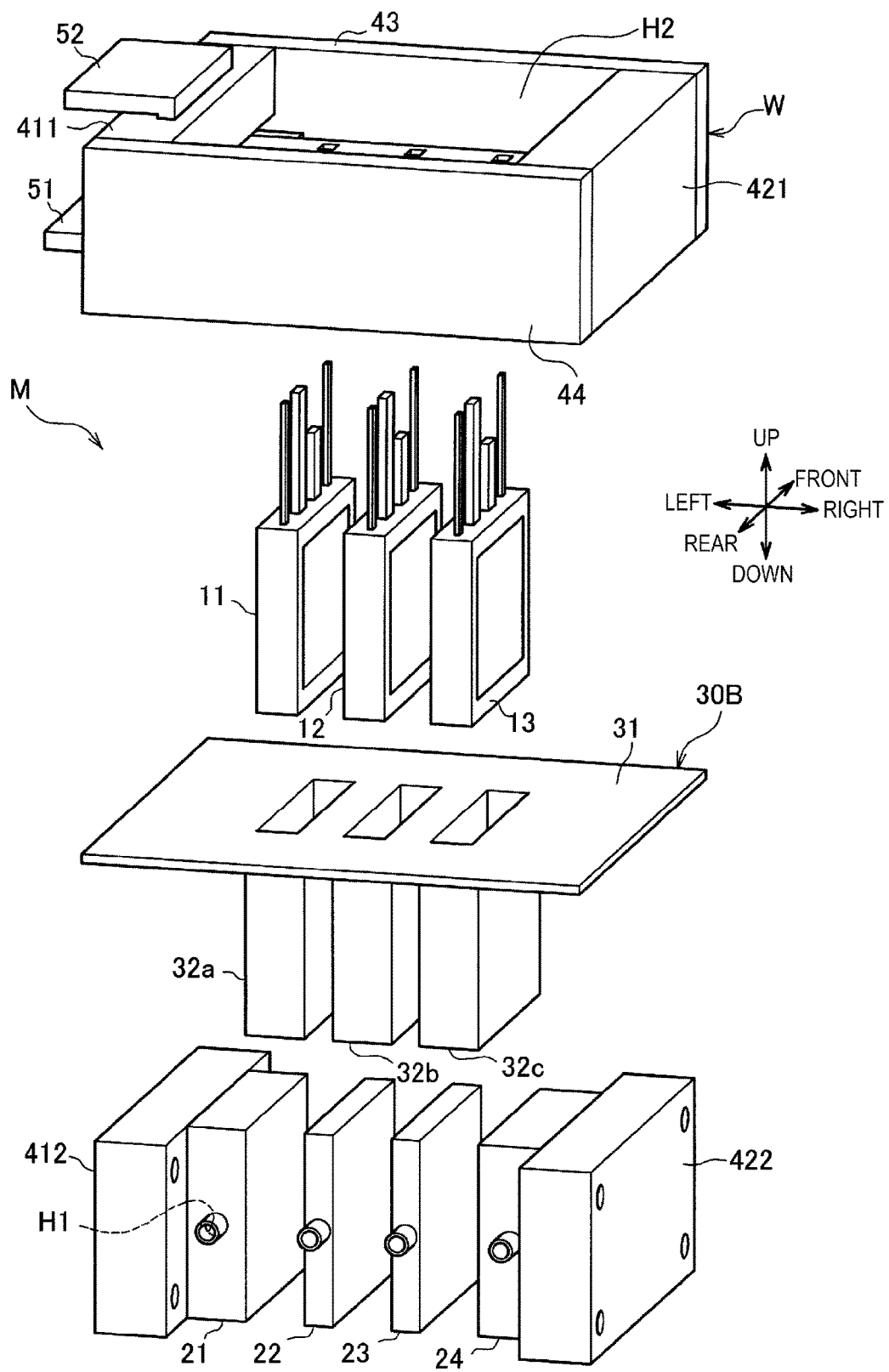

[FIG. 21]
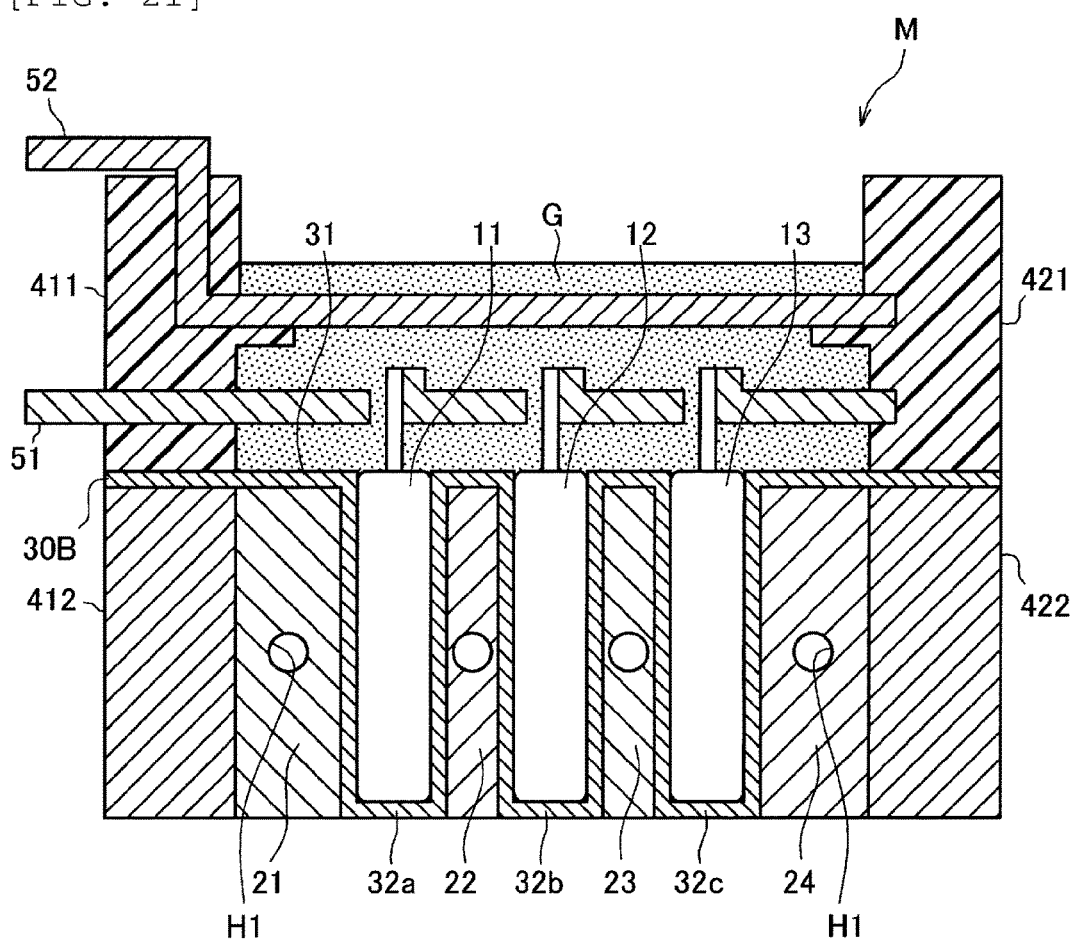
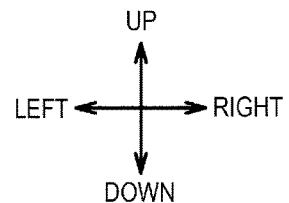

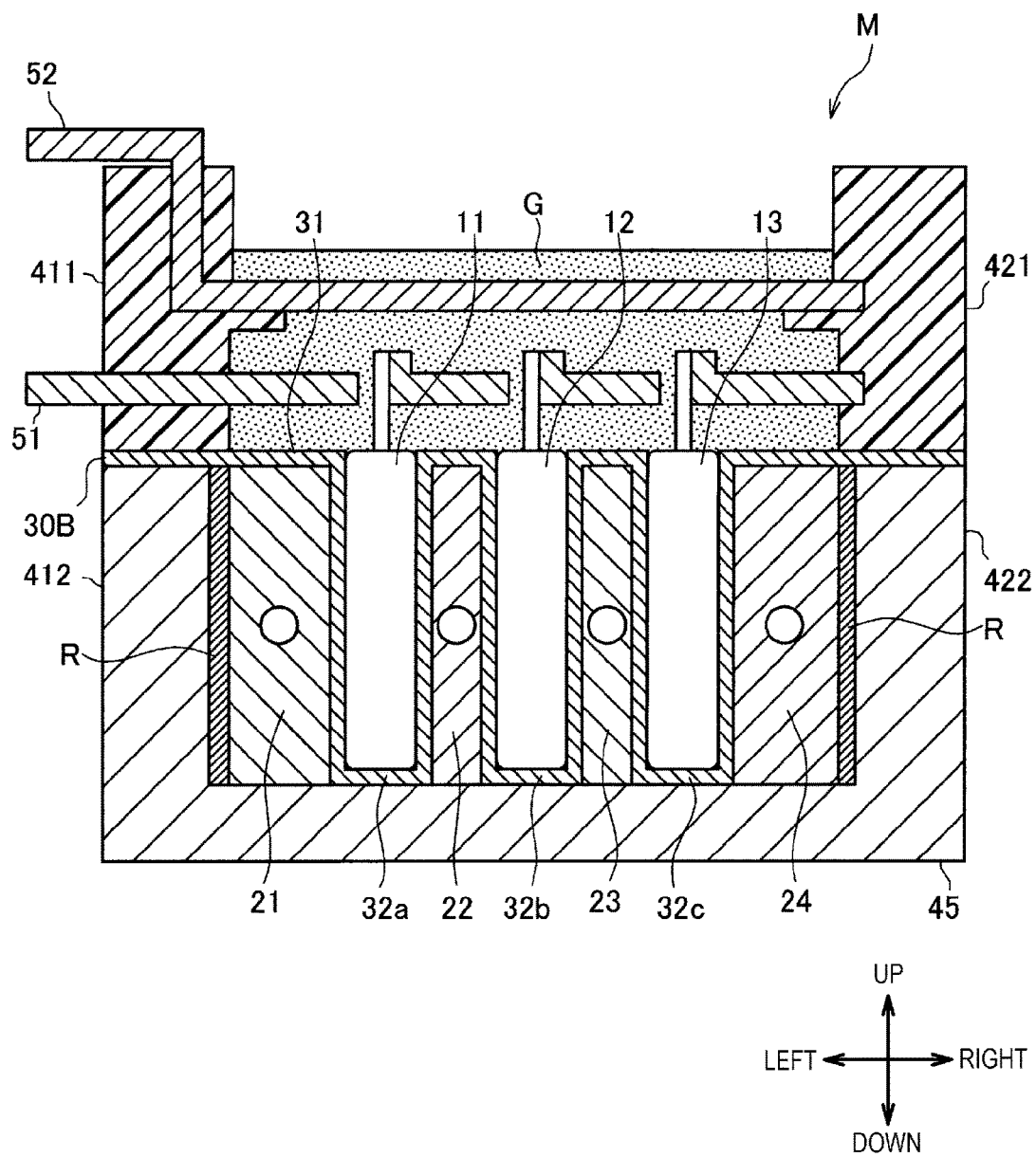
[FIG. 22]

[FIG. 23]
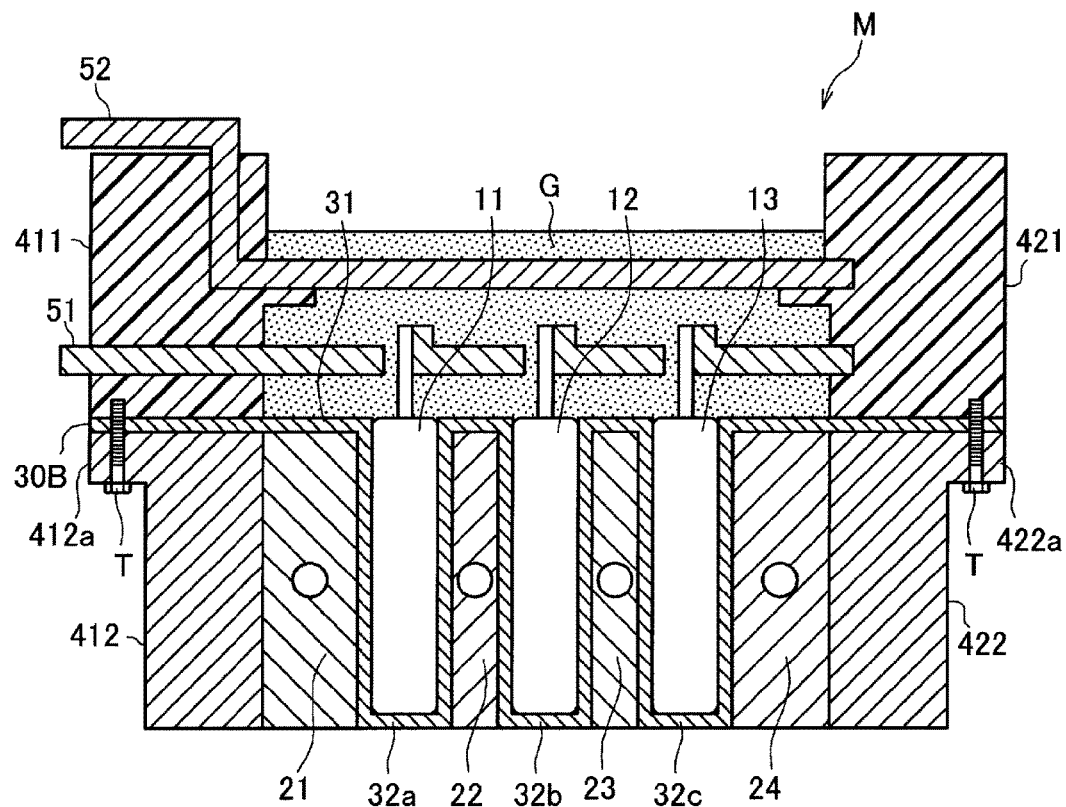
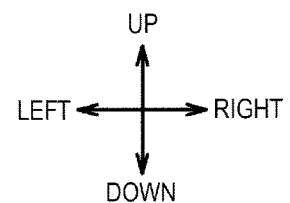

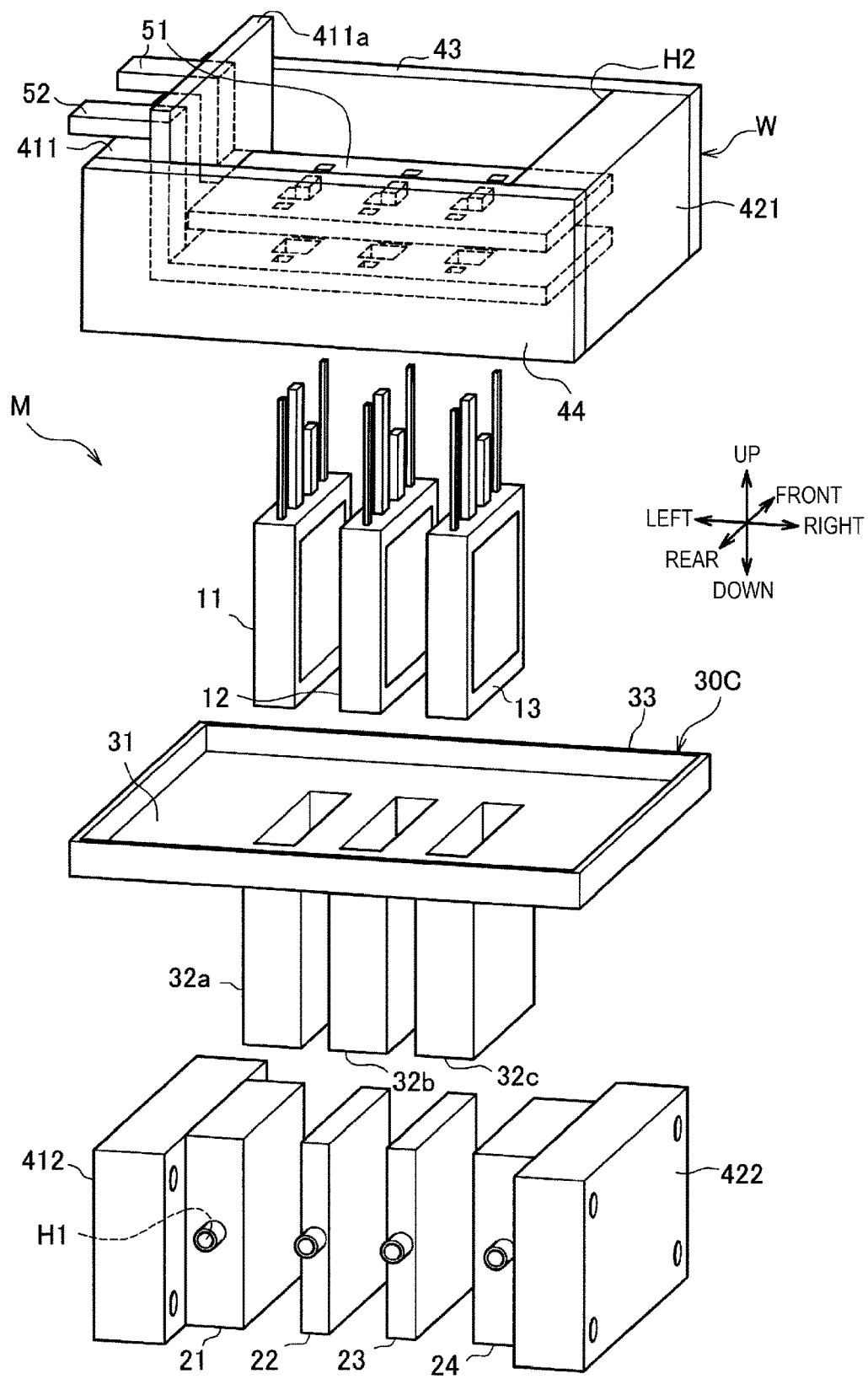
[FIG. 24]

[FIG. 25]
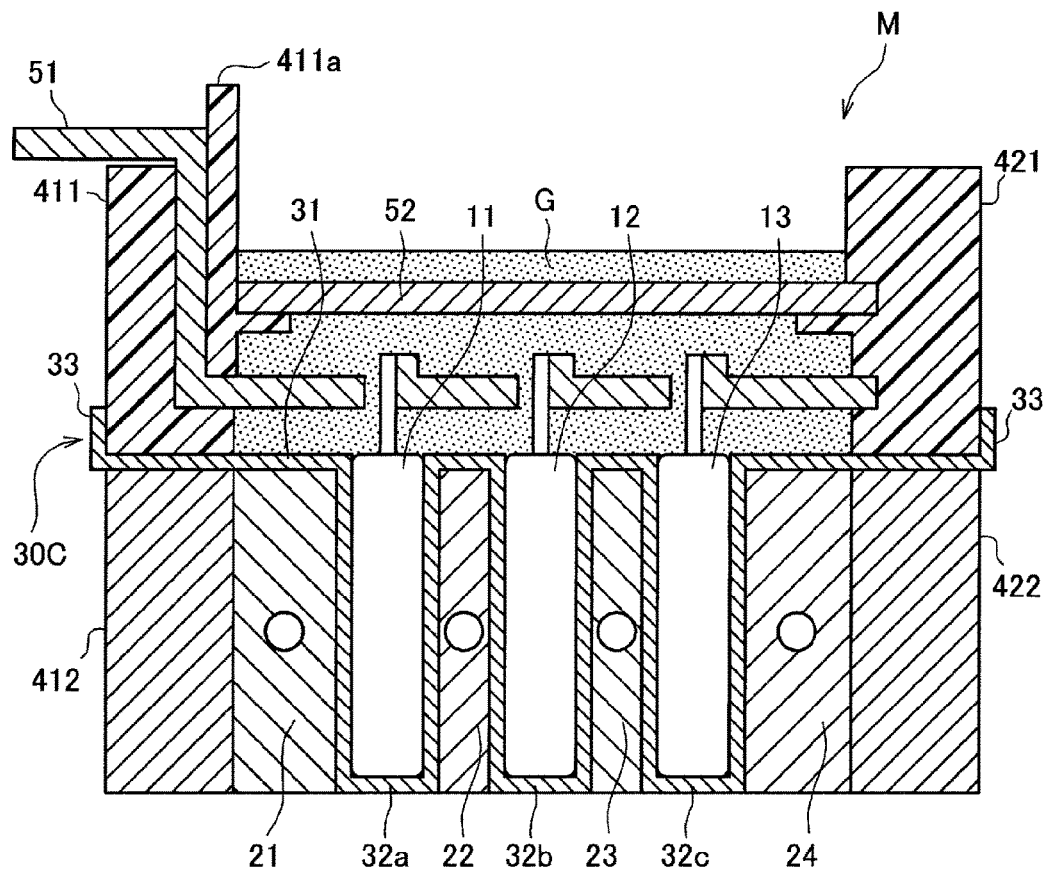
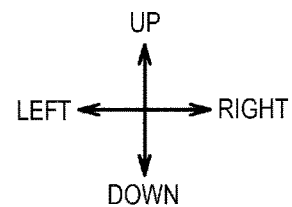

[FIG. 26]
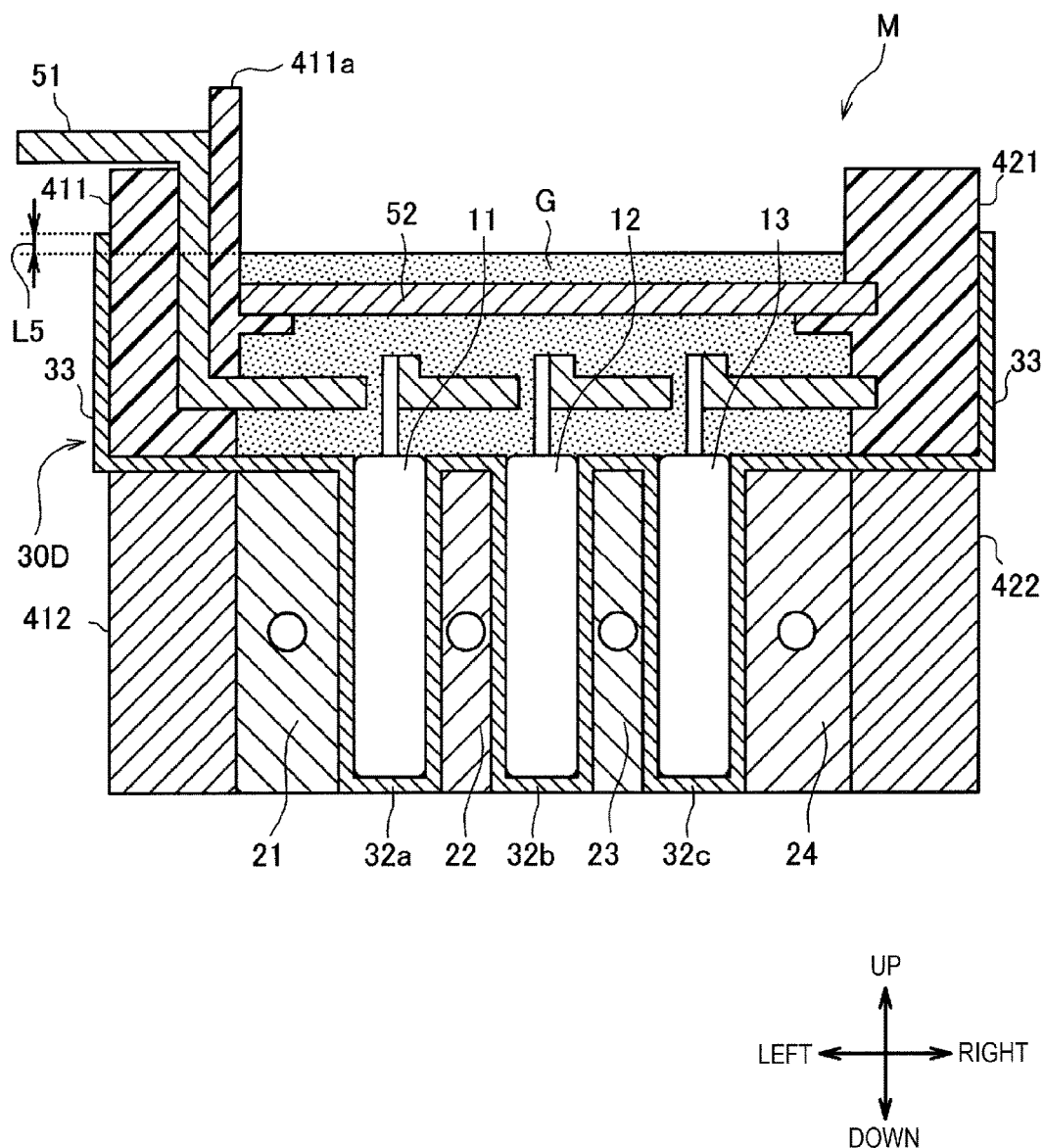

[FIG. 27]
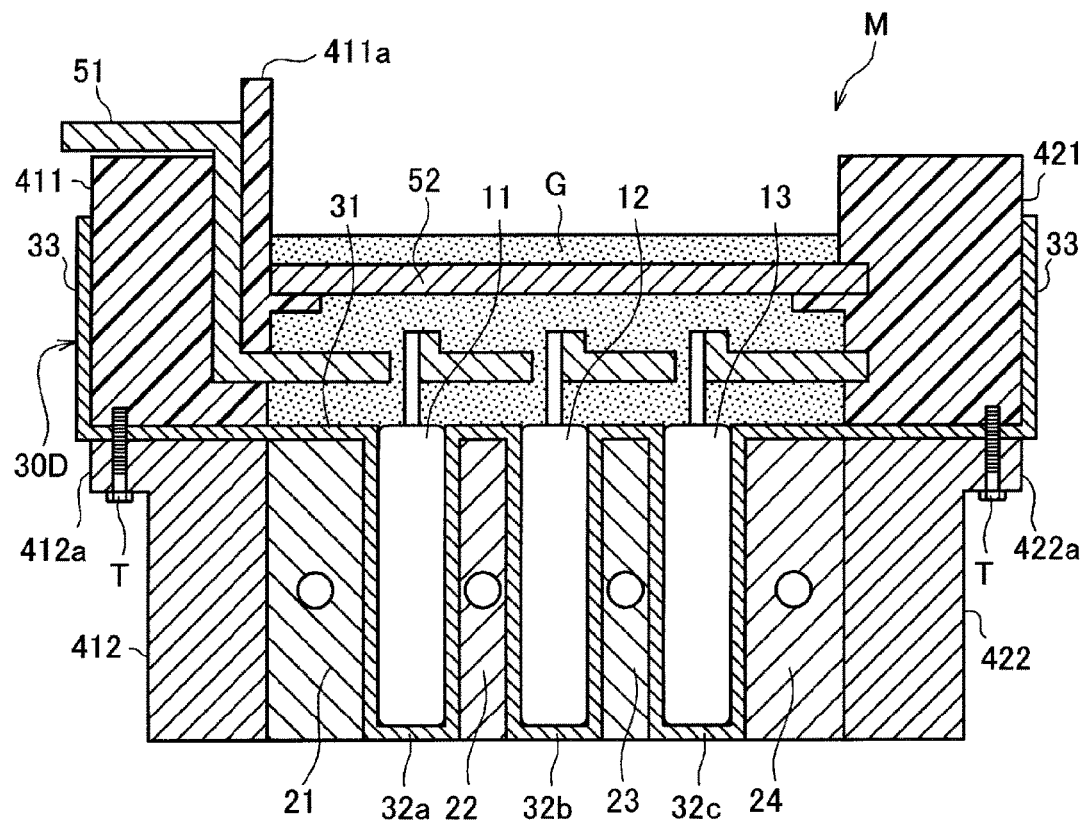
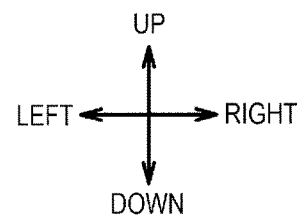

[FIG. 28]
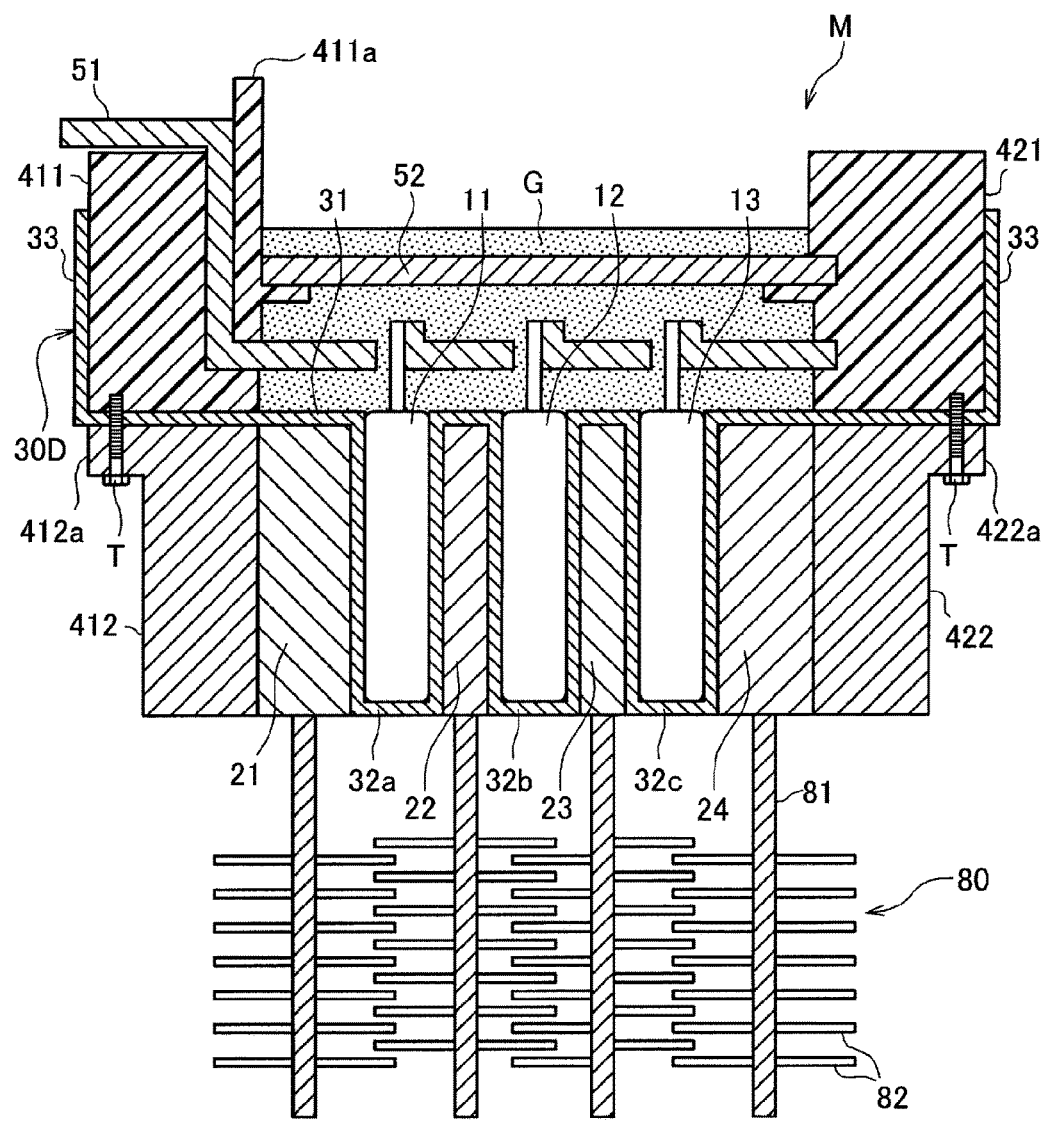
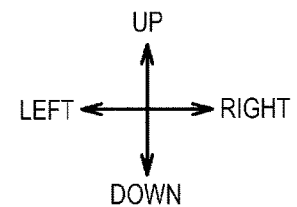

[FIG. 29]
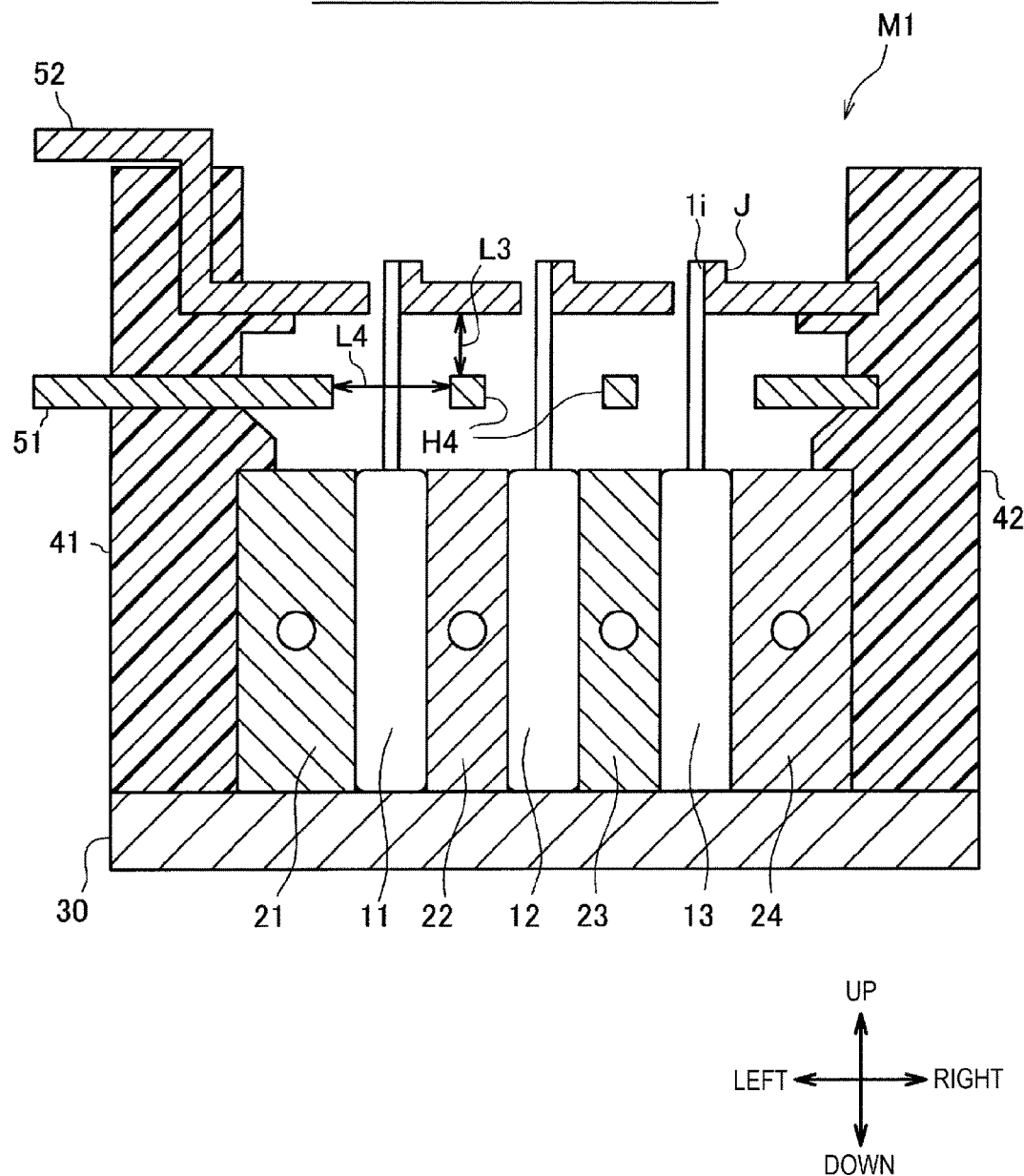

POWER MODULE AND METHOD FOR MANUFACTURING THE SAME

TECHNICAL FIELD

The present invention relates to a power module having a semiconductor element, and a method for manufacturing the same.

BACKGROUND ART

Recently, a power conversion device having a semiconductor element called a power semiconductor chip is used for automobiles, railways, power equipment and the like. For example, installing a high-efficiency power semiconductor chip in a power conversion device enables reduction in energy loss when performing power conversion.

By the way, since the power semiconductor chip generates a large amount of heat due to energization, it is demanded that the power semiconductor chip should be cooled and maintained at an appropriate temperature. Also, miniaturization of the power semiconductor chip is demanded.

For example, PTL 1 discloses a power conversion device having: a semiconductor module having a built-in switching element; and a cooling tube for cooling the semiconductor module. In this power conversion device, a pair of spring members are installed at both ends of a multilayer body made up of semiconductor modules and cooling tubes stacked alternately on each other.

Also, PTL 2 discloses a power semiconductor device having: a plurality of pairs of power modules arranged in such a way that their mold surfaces contact each other; and cooling fins sandwiching heat dissipation surfaces of a pair of power modules from both sides.

CITATION LIST

Patent Literature

PTL 1: JP-A-2011-181687
PTL 2: JP-A-2006-190972

SUMMARY OF INVENTION

Technical Problem

The power conversion device disclosed in PTL 1 has a configuration in which the multilayer body fixed in a housing case that is H-shaped as viewed in a cross section, so as to expose control terminals from one side of the housing case and expose power terminals from the other side.

By the way, in the case of improving the voltage endurance of the power conversion device, the power terminals need to be spaced apart at a predetermined distance or longer from each other so as to secure insulation. Meanwhile, in order to reduce inductance and restrain voltage spikes due to changes in current with time at the time of switching, the distance between the power terminals needs to be shorter. That is, in the power conversion device, improving voltage endurance and reducing inductance are in a trade-off relation.

For example, a case where the distance between the power terminals is increased to improve voltage endurance in the power conversion device disclosed in PTL 1 is considered. In this case, there is a problem that inductance increases by the amount of increase in the distance between the power terminals, thus making voltage spikes more likely to occur. There is also a problem that an increase in size of the power conversion device is inevitable.

In the power semiconductor device disclosed in PTL 2, too, the main terminals (power terminals) are exposed. Therefore, if voltage endurance is to be improved, it leads to an increase in inductance and an increase in size of the device. Moreover there is also a demand that the operability at the time of manufacturing should be improved.

Thus, an object of the invention is to provide a power module or the like in which lower inductance and miniaturization are achieved. Another object of the invention is to provide a power module or the like in which the operability at the time of manufacturing is improved.

Solution to Problem

In order to solve the foregoing problems, a power module according to the invention includes: a main body unit having a semiconductor element, a control terminal connected to the semiconductor element, a power terminal through which a current corresponding to an electrical signal to the control terminal flows, and a heat dissipation layer; a cooling unit which is arranged in such a way as to be able to exchange heat with the heat dissipation layer and cools the main body unit; a busbar connected to the power terminal; a casing in which at least a contact part with the busbar is insulative; and a metal member which supports the casing. The metal member tightly contacts the casing, thereby forming a box with one side opened. At least the main body unit and the busbar are arranged inside the box. The control terminal and the power terminal extend to the one side from the semiconductor element. An insulating sealant is provided to fill the inside of the box, thereby sealing the main body unit and the busbar.

Advantageous Effects of Invention

According to the invention, a power module or the like in which lower inductance and miniaturization are achieved can be provided. Also, according to the invention, a power module or the like in which the operability at the time of manufacturing is improved can be provided.

BRIEF DESCRIPTION OF DRAWINGS

FIG. 1 is a perspective view of a power module according to a first embodiment of the invention, as looked down upon from the right rear.

FIG. 2 is a perspective view of a main body unit.

FIG. 3 is an end view taken along a line C-C shown in FIG. 2.

FIG. 4 is an exploded perspective view of the power module, as looked down upon from the right rear.

FIG. 5 is an end view taken along a line A-A shown in FIG. 1.

FIG. 6 is an end view taken along a line B-B shown in FIG. 1.

FIG. 7 is a perspective view for explaining a process of manufacturing the power module.

FIG. 8 is an exploded perspective view showing Modification 1 of the power module according to the first embodiment of the invention.

FIG. 9 is an exploded perspective view showing Modification 2 of the power module according to the first embodiment of the invention.

FIG. 10 is an exploded perspective view of a power module according to a second embodiment of the invention, as looked down upon from the right rear.

FIG. 11 is an end view of the power module (corresponding to the line A-A shown in FIG. 1).

FIG. 12 is an exploded perspective view showing Modification 1 of the power module according to the second embodiment of the invention.

FIG. 13 is an exploded perspective view showing Modification 2 of the power module according to the second embodiment of the invention.

FIG. 14 is an exploded perspective view showing Modification 3 of the power module according to the second embodiment of the invention.

FIG. 15 is an exploded perspective view of a power module according to a third embodiment of the invention, as looked down upon from the right rear.

FIG. 16 is an end view of the power module (corresponding to the line A-A shown in FIG. 1).

FIG. 17 is an end view of a power module according to a fourth embodiment of the invention (corresponding to the line A-A shown in FIG. 1).

FIG. 18 is an end view of a power module according to a fifth embodiment of the invention (corresponding to the line A-A shown in FIG. 1).

FIG. 19 is a perspective view of a power module according to a sixth embodiment of the invention, as looked down upon from the right rear.

FIG. 20 is an exploded perspective view of the power module, as looked down upon from the right rear.

FIG. 21 is an end view taken along a line A-A shown in FIG. 19.

FIG. 22 is an end view showing Modification 1 of the power module according to the sixth embodiment of the invention (corresponding to the line A-A shown in FIG. 19).

FIG. 23 is an end view showing Modification 2 of the power module according to the sixth embodiment of the invention (corresponding to the line A-A shown in FIG. 19).

FIG. 24 is an exploded perspective view of a power module according to a seventh embodiment of the invention, as looked down upon from the right rear.

FIG. 25 is an end view of the power module (corresponding to the line A-A shown in FIG. 19).

FIG. 26 is an end view showing Modification 1 of the power module according to the seventh embodiment of the invention (corresponding to the line A-A shown in FIG. 19).

FIG. 27 is an end view showing Modification 2 of the power module according to the seventh embodiment of the invention (corresponding to the line A-A shown in FIG. 19).

FIG. 28 is an end view of a power module according to an eighth embodiment of the invention (corresponding to the line A-A shown in FIG. 19).

FIG. 29 is an end view of a power module according to a comparative example.

DESCRIPTION OF EMBODIMENTS

Individual embodiments of the invention will be described in detail with reference to the drawings as needed. In the case of explaining directions, such explanations are given on the basis of front and back, left and right, and up and down, shown in FIG. 1 and the like.

First Embodiment

FIG. 1 is a perspective view of a power module according to this embodiment, as looked down upon from the right rear. In FIG. 1, the illustration of an insulating sealant (gel) that seals each terminal and each busbar is omitted.

A power module M is used for a high-voltage power conversion device (not shown), for example, and carries out a switching operation in response to a command from an external controller (not shown). The power module M has three main body units 11 to 13 (see FIG. 4), four cooling units 21 to 24, a metal member 30, a casing W (left wall 41, right wall 42, front wall 43, rear wall 44), a collector-connecting busbar 51, and an emitter-connecting busbar 52.

(Main Body Unit)

FIG. 2 is a perspective view of the main body unit. The main body unit 11 is configured to conduct or cut off electricity to a collector terminal 1$i$ and an emitter terminal 1$j$ in response to an electrical signal inputted via a control terminal 1$b$. In the example shown in FIG. 2, the main body unit 11 is in the shape of a rectangular parallelepiped. However, the shape of the main body unit 11 is not limited to this.

FIG. 3 is an end view taken along the line C-C shown in FIG. 2

The main body unit 11 mainly has a power semiconductor element 1$a$, the control terminal 1$b$ (see FIG. 2), wiring layers 1$c$, 1$f$, insulating layers 1$d$, 1$g$, heat dissipation layers 1$e$, 1$h$, the collector terminal 1$i$, and the emitter terminal 1$j$ (see FIG. 2). The number of the power semiconductor elements 1$a$ provided in the main body unit 11 may be increased according to the current-carrying capacity.

The power semiconductor element 1$a$ (semiconductor element) is an IGBT (insulated gate bipolar transistor), for example, and is arranged inside the main body unit 11. However, the type of the power semiconductor element 1$a$ is not limited to this. Various elements such as MOSFET (metal-oxide-semiconductor field-effect transistor), GTO (gate turn-off thyristor), and diode, can be used.

The control terminal 1$b$ shown in FIG. 2 is a terminal for inputting an electrical signal inputted from an external controller (not shown), to the power semiconductor element 1$a$. The control terminal 1$b$ is connected to the gate electrode of the power semiconductor element 1$a$ and extends upward from the power semiconductor element 1$a$ (see FIG. 2).

As shown in FIG. 3, the wiring layer 1$c$, the insulting layer 1$d$ and the heat dissipation layer 1$e$ on the collector side are stacked in order from the power semiconductor element 1$a$ toward the left lateral surface of the main body unit 11. Similarly, the wiring layer 1$f$, the insulting layer 1$g$ and the heat dissipation layer 1$h$ on the emitter side are stacked in order from the power semiconductor element 1$a$ toward the right lateral surface of the main body unit 11.

While mainly the wiring layer 1$c$, the insulting layer 1$d$ and the heat dissipation layer 1$e$ on the collector side will be described below, the same applies to the emitter side as well.

The wiring layer 1$c$ contains a metal with low electrical resistance such as copper (Cu), aluminum (Al), or a copper-aluminum alloy. It is preferable that a layer of high thermal conductivity and low thermal expansion (not shown) is provided between the wiring layer 1$c$ and the insulting layer 1$d$. For example, the above layer is formed by diffusing molybdenum, tungsten, carbon or the like on one side of the wiring layer 1$c$ (on the insulting layer 1$d$ side). Thus, withstand current and thermal diffusivity can be maintained while the thermal stress applied to the power semiconductor element 1$a$ is relaxed.

The wiring layer 1$c$ is in the shape of a thin plate and its planar direction is parallel to the left and right lateral surfaces of the main body unit 11. Also, the wiring layer 1$c$ on the collector side and the wiring layer 1$f$ on the emitter side are arranged in such as way that a current flows through these wiring layers in the opposite directions to each other. Since the wiring layers $1c$, $1f$ are thus arranged, the magnetic fields of the wiring layers $1c$, $1f$ are cancelled, enabling a reduction in inductance.

The power semiconductor element $1a$ and the wiring layer $1c$ are electrically joined together, using a joining material made up principally of silver oxide (Ago, $Ag_2O$) or copper oxide (CuO) particles with a particle diameter of 50 μm or below, for example.

The collector terminal $1i$ (power terminal) and the emitter terminal $1j$ (power terminal: see FIG. 2) are terminals for causing a current corresponding to the voltage between control terminals $1b$ to flow. The collector terminal $1i$ is connected to the wiring layer $1c$ on the collector side (see FIG. 3). The emitter terminal $1j$ is connected to the wiring layer $1f$ on the emitter side. The collector terminal $1i$ and the emitter terminal $1j$ extend upward from the power semiconductor element $1a$.

The insulting layer $1d$ shown in FIG. 3 is a resin formed by dispersing a filler of high thermal conductivity such as alumina, aluminum nitride or boron nitride in a sintered plate made of a material of high thermal conductivity such as alumina, aluminum nitride or silicon nitride.

The heat dissipation layer $1e$ is provided in order to release heat generated in the power semiconductor element $1a$ or the like, to the outside, and contains a high-thermal-conductivity material of copper, aluminum, or a copper-aluminum alloy. It is preferable that molybdenum, tungsten or carbon is diffused into the above metal so as to achieve high thermal conductivity and low thermal expansion.

As shown in FIGS. 2 and 3, the respective heat dissipation layers $1e$, $1h$ are exposed from the left and right lateral surfaces of the power semiconductor element $1a$. It is preferable that the exposed surfaces of the heat dissipation layers $1e$, $1h$ are each in the shape of a flat surface and are parallel to each other. Thus, the pressures acting on the heat dissipation layers $1e$, $1h$ from the cooling units 21, 22 (see FIG. 4) are equalized on the above exposed surfaces and the cooling efficiency of the main body unit 11 can be increased.

A resin member $1k$ is a member which seals each layer including the power semiconductor element $1a$ by being transfer-molded. When performing transfer molding, the control terminal $1b$, the collector terminal $1i$ and the emitter terminal $1j$ are positioned in the arrangement shown in FIGS. 2 and 3.

As the resin member $1k$, a phenol-based, acryl-based, polyimide-based, polyamide-imide-based, epoxy-based, silicon-based, bismaleimide-triazine-based, cyanate ester-based or like resin with an adhesive property can be used. It is preferable that the resin member $1k$ contains a ceramic such as $SiO_2$, $Al_2O_3$, AlN or BN, or a gel or rubber. Thus, the resin member $1k$ can have low thermal expansion and the thermal stress acting on the power semiconductor element $1a$ and the insulting layers $1d$, $1g$ can be reduced.

When transfer-molding the resin member $1k$, the heat dissipation layers $1e$, $1h$ are exposed from this resin member $1k$. If the heat dissipation layers $1e$, $1h$ are not exposed, it is preferable that the resin member concealing the heat dissipation layers $1e$, $1h$ is ground so as to expose the heat dissipation layers $1e$, $1h$.

As shown in FIG. 3, by providing the heat dissipation layer $1e$ ($1h$) on the outer side of the insulating layer $1d$ ($1g$) and then sealing them with the resin member $1k$, sufficient insulation and thermal conductivity of the main body unit 11 can be secured. The configuration shown in FIG. 3 is an example, and the configuration of the main body unit 11 is not limited to this. Also, the other main body units 12, 13 (see FIG. 4) have a similar configuration.

(Cooling Unit)

FIG. 4 is an exploded perspective view of the power module, as looked down upon from the right rear.

The cooling unit 21 is for cooling the main body unit 11 or the like and arranged in such a way as to be able to exchange heat with the above heat dissipation layer $1e$. The cooling unit 21 is a metal member of high thermal conductivity (for example, copper) and its external shape is the shape of a rectangular parallelepiped. The same applies to the other cooling units 22 to 24.

Hereinafter, the main body units 11 to 13 may be collectively referred to as "main body units 10" and the cooling units 22 to 24 may be collectively referred to as "cooling units 20".

The power module M according to this embodiment has the four cooling units 21 to 24. As shown in FIG. 4, the main body units 10 and the cooling units 20, in the state of being in tight contact with each other, are arranged (stacked) alternately in a left-right direction. A multilayer body K made up of the main body units 10 and the cooling units 20 is pressed in the left-right direction by fasters Q, described later (see FIG. 7). Thus, the heat dissipation layers $1e$, $1h$ of the main body units 10 and the cooling units 20 come in tight contact with each other and the heat generated in the power semiconductor elements $1a$ or the like is dissipated to the cooling units 20 via the heat dissipation layers $1e$, $1h$.

The cooling units 20 are provided with a flow path H1 (see FIG. 5) for allowing cold water to flow. A cooling pipe P2 is connected to each of an upstream end and a downstream end of the above flow path H1 (see FIG. 4).

It is preferable that a high-thermal-conductivity sheet (not shown) such as grease or carbon sheet is provided between the main body units 10 and the cooling units 20. By thus installing a thermally conductive sheet that is flexible and can be easily deformed, variations in dimension in the left-right direction of the main body units 10 and the cooling units 20 can be absorbed, and positioning accuracy and thermal conductivity can be improved.

(Metal Member)

The metal member 30 shown in FIG. 4 supports the casing W, described later, and is in the shape of a rectangular parallelepiped that is thin in an up-down direction. The metal member 30 has the function of releasing the heat absorbed by the cooling units 20 to the outside, and the function of preventing leakage of an insulating sealant G by being in tight contact with the casing W. It is preferable that the metal member 30 is formed of a metal that can be easily molded, such as copper (Cu), aluminum (Al), or a copper-aluminum alloy.

The above-described multilayer body K made up of the main body units 10 and the cooling units 20 is placed on the metal member 30.

Inside the metal member 30, a flow path (not shown) for allowing cooling water to flow is formed. In this embodiment, an inlet and an outlet for the cooling water are provided on the right lateral side of the metal member 30, and (eight) connection ports of the cooling pipe P2 (see FIG. 4) are provided on the top side. The flow path formed inside the metal member 30 is formed in such a way as that the cooling water flowing in from the above inlet diverges corresponding to the respective cooling units 21 to 24 and that the cooling water from which the heat is absorbed by the cooling units 21 to 24 is merged together and taken out from the outlet.

(Casing)

The casing W (left wall 41, right wall 42, front wall 43, rear wall 44) has a hole H2 (see FIG. 1) which is rectangular as viewed in a plan view, and is in tight contact with the above metal member 30. As the casing W comes in tight contact with the metal member 30, a box B (see FIG. 1) opened on one side (top side) is formed.

The left wall 41 and the right wall 42 are insulating members which fix and support the collector-connecting busbar 51 and the emitter-connecting busbar 52, and are each in the shape of a rectangular parallelepiped that is thin in the left-right direction. That is, at least the parts that contact the busbars 51, 52 (left wall 41 and right wall 42), of the above casing W, are insulative. The left wall 41 and the right wall 42 are formed of a polyphenylene sulfide resin, for example.

FIG. 5 is an end view taken along the line A-A shown in FIG. 1.

The left wall 41 has a protrusion 41a which supports the collector-connecting busbar 51, and a protrusion 41b which supports the emitter-connecting busbar 52. The respective protrusions 41a, 41b protrude toward the right and extend in a front-rear direction. The protrusions 41a, 41b are formed in such a way as to be able to secure an insulation distance of the busbars 51, 52 in the state of being sealed with the insulating sealant G, described later. The same applies to protrusions 42a, 42b formed on the right wall 42.

The position (height) where the lower protrusion 41a is provided corresponds to the length in the up-down direction of the cooling unit 21, and the cooling unit 21 is fitted in a recess formed by the metal member 30 and the protrusion 41a. Similarly, the cooling unit 24 is fitted in a recess formed by the metal member 30 and the protrusion 42a. Thus, the multilayer body K made up of the main body units 10 and the cooling units 20 can be positioned easily and with high accuracy.

Also, recesses 42c, 42d in which the right ends of the respective busbars 51, 52 are fitted are formed above the protrusions 42a, 42b provided on the right wall 42.

The front wall 43 and the rear wall 44 shown in FIG. 4 are each in the shape of a rectangular parallelepiped that is thin in the front-rear direction. It is preferable that the front wall 43 and the rear wall 44 are insulating members (for example, polyphenylene sulfide resin) as well, in order to secure insulation between the collector-connecting busbar 51 and the emitter-connecting busbar 52.

(Collector-Connecting Busbar)

The collector-connecting busbar 51 (busbar) shown in FIG. 4 is a metal member electrically connected to the collector terminals 1i. The collector-connecting busbar 51 is in the shape of a thin plate in order to decrease electrical resistance and reduce the Joule heat due to high current.

The collector-connecting busbar 51 is provided with (six) through-holes H3 for drawing out the control terminals 1b to the outside, (three) through-holes H4 for drawing out the emitter terminals 1j upward, and (three) connecting parts I for connecting the collector terminals 1i to the collector-connecting busbar 51.

Particularly, the hole diameter of the through-holes H4, through which the emitter terminals 1j are drawn out, is set in such a way as to be able to secure an insulation distance between the emitter terminals 1j and the collector-connecting busbar 51 in the state of being sealed with the insulating sealant G, described later.

The connecting parts I are formed by forming slits at parts of the collector-connecting busbar 51 corresponding to the collector terminals 1i and then bending these parts upward.

Thus, holes H5 for drawing out the collector terminals 1i, and the connecting parts I for connecting the collector terminals 1i to the collector-connecting busbar 51 can be formed simultaneously, and operability can be enhanced.

(Emitter-Connecting Busbar)

FIG. 6 is an end view taken along the line B-B shown in FIG. 1.

The emitter-connecting busbar 52 (busbar) is a thin plate-shaped metal member through which a current flows via the emitter terminals 1j, and is electrically connected to the emitter terminals 1j. The emitter-connecting busbar 52 is provided with the (six) through-holes H3 (see FIG. 4) for drawing out the control terminals 1b, and (three) connecting parts J for connecting the emitter terminals 1j to the emitter-connecting busbar 52.

(Arrangement and Connecting Relation of Respective Busbars)

As shown in FIGS. 4 to 6, the collector-connecting busbar 51 and the emitter-connecting busbar 52 are arranged parallel to each other and arranged in such a way that the current flowing through one is in the opposite direction to the current flowing through the other. Thus, the magnetic fields generated by the currents flowing through the respective busbars 51, 52 are cancelled and therefore inductance can be reduced.

Also, as described later, the collector-connecting busbar 51 and the emitter-connecting busbar 52 are sealed with the insulating sealant G as well. Therefore, even if a distance L1 (see FIG. 5) between the busbars 51, 52 is made relatively small (that is, even if inductance is reduced), there is no risk of discharge.

In order to insulate the collector-connecting busbar 51 and the emitter-connecting busbar 52 from each other, it is preferable that a sufficient distance L2 (see FIG. 5) between the respective busbars 51, 52 is secured in the air. In this embodiment, the collector-connecting busbar 51 and the left wall 41 are integrally formed by thermocompression bonding or injection molding, and the collector-connecting busbar 51 is configured to be in a straight line, as viewed in a side cross-sectional view, and exposed from the left wall 41.

Similarly, the emitter-connecting busbar 52 and the left wall 41 are integrally formed, and the emitter-connecting busbar 52 is configured to be exposed from the top surface of the left wall 41 (that is, the emitter-connecting busbar 52 is bent in an L-shape inside the left wall 41). That is, the distance L1 between the busbars 51, 52 is made relatively short in the space sealed with the insulating sealant G, whereas the distance L2 between the busbars 51, 52 is made sufficiently long in the air, thereby securing insulation between the busbars 51, 52.

Also, the busbars 51, 52 may be separate from the left wall 41, instead of being integrally formed with the left wall 41, and the busbars 51, 52 may be arranged on the left wall 41 by caulking (not shown).

As described above, the collector terminals 1i in the main body units 11, 12, 13 are connected to the collector-connecting busbar 51 (see FIG. 5), and the emitter terminals 1j are connected to the emitter-connecting busbar 52 (see FIG. 6). That is, the three main body units 11, 12, 13 are electrically connected in parallel.

For example, as synchronized control signals are inputted from the respective control terminals 1b, the respective power semiconductor elements 1a (see FIG. 3) synchronously perform on/off operation as well, and a high current due to this operation flows through the collector-connecting busbar 51 and the emitter-connecting busbar 52. In this case, the entirety of the power module M functions as one large switching circuit. The use of the power module M is not limited to the above example.

<Process of Manufacturing Power Module>

FIG. 7 is a perspective view for explaining a process of manufacturing the power module.

First, the main body units 11 to 13 (main body units 10) and the cooling units 21 to 24 (cooling units 20) are arranged alternately in the left-right direction and positioned in the state of being in tight contact with each other (positioning process). For example, the multilayer body K made up of the main body units 10 and the cooling units 20 is placed on the metal member 30, and a jig (not show) is placed with respect to the front surface of the metal member 30 as a reference surface, thereby positioning the main body units 10 and the cooling units 20 in the front-rear direction.

Next, the left wall 41 is pressed from the left side against the cooling unit 21 situated at the left end, and the right wall 42 is pressed from the right side against the cooling unit 24 situated at the right end, thus positioning the main body units 10 and the cooling units 20 in the left-right direction.

In order to facilitate the positioning, a groove (not shown) in the left-right direction may be provided on the top surface of the metal member 30, and the main body units 10, the cooling units 20 and the casing W may be placed with reference to this groove. Thus, since the above jig is no longer necessary, operability can be enhanced.

When placing the left wall 41 and the right wall 42 on the metal member 30, the control terminals 1b are inserted through the above through-holes H3, the emitter terminals 1j are inserted through the through-holes H4, and the collector terminals 1i are inserted through the holes H5 (see FIG. 4).

Also, the collector-connecting busbar 51 is fitted in the recess 42c in the right wall 42, and the emitter-connecting busbar 52 is fitted in the recess 42d in the right wall 42 (see FIG. 5). As the busbars 51, 52 are supported in this manner, the stress acting on the collector terminals 1i and the emitter terminals 1j (stress generated by the weight of the busbars 51, 52) can be restrained.

Next, the collector terminals 1i and the collector-connecting busbar 51 are welded (for example, spot-welded) at the connecting parts I (see FIG. 5), and the emitter terminals 1j and the emitter-connecting busbar 52 are welded at the connecting parts J (see FIG. 6). Thus, the main body units 10 and the busbars 51, 52 are electrically connected together (connecting process).

Next, for example, the four sets of fasteners Q placed and bolted to the left wall 41 and the right wall 42, thus pressing the left wall 41 and the right wall 42 in a compressing manner from left and right (pressing process). Thus, the multilayer body K made up of the main body units 10 and the cooling units 20 is pressed, and the heat dissipation layers 1e, 1h (see FIG. 3) and the cooling units 20 come in tight contact with each other.

Since the pressing force of the fasteners Q is substantially uniform in the front-rear and up-down directions, a pressing force that is substantially uniform in the planar direction of the heat dissipation layers 1e, 1h and the cooling units 20 acts on them as well. Therefore, the thermal resistance between the main body units 10 and the cooling units 20 can be reduced.

Next, as shown in FIG. 7, openings on one side of the cooling pipes P2 are connected to holes H6 provided on the top surface of the metal member 30, and openings on the other side of the cooling pipes P2 are connected to the flow path H1 provided in the cooling units 20 (pipe installing process). The cooling pipes P2 are curved as viewed from the left-right direction in order not to interfere with the metal member 30.

The order of the connecting process, the pressing process and the pipe installing process described above may be switched as appropriate.

Next, the above casing W (see FIG. 4) and the metal member 30 are fixed together at a plurality of positions with screw members (not shown). Moreover, in the state where the metal member 30 and the casing W are in tight contact with each other, the interface between these is coated with a coating material (coating process). Consequently, the box B (see FIG. 1) opening only on the top side is formed by the metal member 30 and the casing W.

Next, the inside of the box B where the main body units 10, the cooling units 20, the collector-connecting busbar 51 and the emitter-connecting busbar 52 are arranged is filled and sealed with the insulating sealant G (sealing process). Although the insulating sealant G is liquid at the time of filling, since the interface between the metal member 30 and the casing W is coated, as described above, there is no risk of the insulating sealant G leaking to the outside.

As the insulating sealant G, a silicone gel or potting resin can be used, for example. However, the insulating sealant G is not limited to the above and other types of gels or resins may also be used.

The insulating sealant G is poured in until its liquid surface reaches above the emitter-connecting busbar 52 (see FIGS. 5 and 6). As the power module M filled with the insulating sealant G is maintained within a predetermined temperature range, the insulating sealant G solidifies.

Advantageous Effects

According to this embodiment, the multilayer body K is accommodated in the box B (see FIG. 1) made up of the metal member 30 and the casing W (see FIG. 4), and cold water is made to flow in the cooling units 20, thus enabling heat dissipation from the main body units 10. Also, the pressing force of the fasteners Q brings the main body units 10 and the cooling units 20 into tight contact, thus enabling highly efficient cooling of the main body units 10.

Also, the box B made up of the metal member 30 and the casing W is opened only on the top side, and the interface between them is coated with the coating material. Therefore, there is no risk of leakage of the insulating sealant G poured in the accommodation space in the box B, and the collector terminals 1i, the emitter terminals 1j and the busbars 51, 52 can be properly sealed with the insulating sealant G.

Moreover, since each of the manufacturing processes described above requires no complicated work, the operability at the time of manufacturing can be improved.

Also, since the collector-connecting busbar 51 and the emitter-connecting busbar 52, each in the shape of a thin plate, are arranged opposite each other and substantially parallel to each other, the magnetic fields generated by the flow of currents can be cancelled and the inductance between the busbars 51, 52 can be reduced. Moreover, since the busbars 51, 52 are sealed with the insulating sealant G, the distance L1 (see FIG. 5) between the busbars 51, 52 can be made relatively small in the up-down direction.

FIG. 29 is an end view of a power module according to a comparative example.

If a power module M1 is not sealed with the insulating sealant G, increasing a distance L3 between the busbars 51, 52 is inevitable in order to secure an insulation distance, and this leads to an increase in inductance L and an increase in size of the power module M1. If a temporal change in current (di/dt) due to switching occurs, a voltage spike with a large L (di/dt) is generated and there is a risk of malfunctioning of the power semiconductor elements 1a (see FIG. 3). Moreover, increasing the diameter of the through-holes H4 is inevitable in order to secure an insulation distance (diameter L4: see FIG. 29), and this makes it necessary to increase the front-rear width of the collector-connecting busbar 51.

In contrast, according to this embodiment, since the busbars 51, 52 and the like are sealed with the insulating sealant G, the busbars 51, 52 can be brought closer to each other while an insulation distance is secured. Therefore, the inductance can be reduced significantly and the voltage spike at the time of switching can be reduced. Thus, since even switching operations carried out in a short time do not damage the power semiconductor elements 1a, the loss per switching operation can be reduced and the loss in the entirety of the power module M (that is, the amount of heat generated) can be restrained. Also, since the respective busbars 51, 52 are arranged parallel to each other and the distance of the respective busbars is reduced, the power module M can be reduced in size.

In this way, according to this embodiment, lower inductance and miniaturization of the power module M can be achieved, thus enabling the power module to cope with high-voltage and high-current applications.

First Embodiment: Modification 1

FIG. 8 is an exploded perspective view showing Modification 1 of the power module according to the first embodiment.

If the amounts of heat generated by the respective main body units 10 are substantially the same, the cooling units 22, 23 with the main body units 10 arranged on both left and right sides are more likely to have a temperature rise than the cooling units 21, 24 with the main body units 10 arranged on one side only. Thus, the cooling units 22, 23 may be preferentially cooled, as shown in FIG. 8.

Inside the metal member 30 shown in FIG. 8, a flow path (not shown) for guiding the cooling water which flows in via pipes P1, Pa on the supply side, to the cooling pipes P2 corresponding to the cooling units 22, 23, is formed. Also, inside the metal member 30, a flow path (not shown) for guiding the cooling water from the cooling pipes P2 corresponding to the cooling units 21, 24, to pipes Pb, P3 on the discharge side, is formed.

On the front side of the main body units (back side in the illustration), a cooling pipe (not shown) for guiding the cooling water from the cooling unit 22 to the cooling unit 21, and a cooling pipe (not shown) for guiding the cooling water from the cooling unit 23 to the cooling unit 24 are installed.

The cooling water diverging into the pipes Pa flows into the cooling units 22, 23 via the cooling pipes P2. The cooling water, absorbing heat when flowing through the cooling units 22, 23, flows into the cooling units 21, 24 via the cooling pipes (not shown) on the back side in the illustration. The cooling water, further absorbing heat when flowing through the cooling units 21, 24, merges into the pipe P3 via the pipes Pb.

The configuration shown in FIG. 8 enables enhancement of the cooling efficiency of the respective cooling units 20.

First Embodiment: Modification 2

FIG. 9 is an exploded perspective view showing Modification 2 of the power module according to the first embodiment.

In the example shown in FIG. 9, the busbars 51, 52 extend in the front-rear direction (whereas in the first embodiment, the busbars 51, 52 extend in the left-right direction: see FIG. 4). The busbars 51, 52, and the left wall 41 and the right wall 42, are spaced apart in the left-right direction as viewed in a plan view.

As the direction of installation of the busbars 51, 52 is thus changed, the busbars 51, 52 do not contact the left wall 41 and the right wall 42 when the left wall 41 and the right wall 42 are pressed by the fasteners Q. That is, no resistive force (reaction force) from the busbars 51, 52 acts on the left wall 41 and the right wall 42, and the multilayer body K can be sufficiently pressed with a relatively small force (fastening with the fasteners Q).

The busbars 51, 52 may be supported by the front wall 43 and the rear wall 44, and the busbars 51, 52 may be exposed to the outside via one of the left wall 41 and the right wall 42. Even in this case, since the busbars 51, 52 do not contact the other of the left wall 41 and the right wall 42, the multilayer body K can be sufficiently pressed with a relatively small force.

In this way, as the direction in which the busbars 51, 52 are taken out is made selectable, the degree of freedom in layout can be increased in a device having a plurality of power modules M (that is, where a plurality of busbars are electrically connected), and consequently this entire device can be miniaturized.

Second Embodiment

A second embodiment is different from the first embodiment in that the left wall 41 is divided into an insulating member 411 (see FIG. 10) and a pressurizing member 412 and that the right wall 42, too, is divided into an insulating member 421 and a pressurizing member 422. However, the other parts are similar to the first embodiment. Therefore, the different parts from the first embodiment are described and explanation of the same parts is omitted.

<Configuration of Power Module>

FIG. 10 is an exploded perspective view of the power module according to this embodiment, as looked down upon from the right rear. The left wall 41 has the insulating member 411 in which the busbars 51, 52 are installed, and the pressurizing member 412 which supports this insulating member 411. The right wall 42 similarly has the insulating member 421 and the pressurizing member 422.

The pair of pressurizing members 412, 422 are each in the shape of a rectangular parallelepiped and arranged on both sides in the stacking direction (left-right direction) of the multilayer body K made up of the main body units 10 and the cooling units 20. Also, the pressurizing members 412, 422 are pressed from left and right by the fasteners Q. Since this causes the multilayer body K to be pressed in such a way as to be compressed from left and right, the main body units 10 and the cooling units 20 come in tight contact with each other.

In the state where the pressurizing members 412, 422 are fixed to the metal member 30, the interface between them is coated with a coating material.

It is preferable that the pressurizing members 412, 422 are made of a metal (for example, copper). This is for increasing the rigidity of the pressurizing members 412, 422 and reducing bending deformation due to pressurization, thereby causing the pressing force to act uniformly on the left and right lateral sides of the multilayer body K. This enables an increase in efficiency of heat exchange between the main body units 10 and the cooling units 20. Also, the heat generated in the busbars 51, 52 can be transferred more easily to the metal member 30 via the pressurizing members 412, 422, and the temperature rise in the insulating members 411, 421 can be restrained.

FIG. 11 is an end view of the power module (corresponding to the line A-A shown in FIG. 1). As shown in FIG. 11, the pair of insulating members 411, 421 are placed on the above pressurizing members 412, 422. The insulating members 411, 421 are made of a polyphenylene sulfide resin, for example, and each in the shape of a rectangular parallelepiped. The insulating member 411 on the left side is integrally molded with the collector-connecting busbar 51 and the emitter-connecting busbar 52. Also, the protrusions 41b, 42b which support the emitter-connecting busbar 52 are formed on the insulating members 411, 421.

<Process of Manufacturing Power Module>

In the state where the fasteners Q (see FIG. 10) are placed and pressing the pressurizing members 412, 422 from left and right, the insulating members 411, 421 are placed on the pressurizing members 412, 422. As shown in FIG. 11, the pair of insulating members 411, 421 opposite each other are supported in the state of being in tight contact with the pair of pressurizing members 412, 422 opposite each other, thereby forming the left wall 41 and the right wall 42 (a pair of sidewalls).

Next, as shown in FIG. 10, the front wall 43 and the rear wall 44 (different sidewalls) are placed on the metal member 30. Then, the interface between the "casing" (pressurizing members 412, 422, insulating members 411, 421, front wall 43, rear wall 44) and the metal member 30 is coated with a coating material. A "box" filled with the insulating sealant G is formed by the above "casing" and the metal member 30.

Advantageous Effects

According to this embodiment, when the pressurizing members 412, 422 are pressed in the left-right direction by the fasteners Q, the above pressing is not obstructed by a resistive force (reaction force) from the busbars 51, 52. This is because the insulating members 411, 421 are not fixed to the pressurizing members 412, 422 when placing the fasteners Q. Therefore, the multilayer body K can be properly pressed with a relatively small force.

Also, since no resistive force by the busbars 51, 52 acts thereon, the pressing force in the left-right direction by the fasteners Q acts uniformly on the left and right lateral sides of the multilayer body K. Therefore, the main body units 10 and the cooling units 20 can be brought into tight contact, and the thermal resistance at the time of heat exchange between these units can be reduced.

Second Embodiment: Modification 1

FIG. 12 is an exploded perspective view showing Modification 1 of the power module according to this embodiment.

In the first and second embodiments, the case of using the cooling pipes P2 in a curved shape as viewed from the left-right direction (not shown in FIG. 10; see FIG. 4) is described. However, pipes P1, Pc, P3 may be placed, as shown in FIG. 12.

The pipe P1 on the supply side is placed on the rear side of the multilayer body K (forward side in the illustration) and extends in the left-right direction. Four pipes Pc are connected to the pipe P1 so as to cause the cooling water to diverge toward the respective cooling units 20. The outlets of the respective pipes Pc are connected to holes (not shown) provided in the cooling units 20.

Similarly, the pipe P3 on the discharge side is placed on the front side of the multilayer body K (back side in the illustration) and extends in the left-right direction. Four pipes (not shown) are connected to the pipe P3 so as to cause the cooling water flowing out of the respective cooling units 20 to merge.

In the pressurizing member 422 on the right side, a hole H7 to pass the supply-side pipe P1 through, and a hole H8 to pass the discharge-side pipe P3 through, are formed.

The pipes P1, P3 are passed through the above holes H7, H8 so that their inlet and outlet are exposed to the outside. In this state, the pressurizing member 422 on the right side can slide in the left-right direction. As the fasteners Q (see FIG. 10) are placed on and press the pressurizing members 412, 422 from left and right, the main body units 10 and the cooling units 20 come in tight contact with each other.

When the cooling water is supplied via the supply-side pipe P1, this cooling water diverges into the four pipes Pc. The cooling water flowing through the cooling units 20 absorbs heat from the main body units 10 and flows into pipes (not shown) situated to the front of the multilayer body K. The cooling water flowing through the respective pipes merges in the discharge pipe P3 and is discharged.

As the respective pipes are arranged as shown in FIG. 12, a flow path no longer needs to be provided inside the metal member 30 and the time and effort for manufacturing the metal member 30 can be saved.

Second Embodiment: Modification 2

FIG. 13 is an exploded perspective view showing Modification 2 of the power module according to this embodiment.

As in Modification 1 of the first embodiment (see FIG. 8), the cooling units 22, 23 situated near the center may be cooled preferentially over the cooling units 21, 24 situated at both left and right ends.

As shown in FIG. 13, the pipe P1 on the supply side extending in the left-right direction is connected to the cooling units 22, 23 via pipes Pd. The discharge pipe P3 extending in the left-right direction is connected to the cooling units 21, 24 via pipes Pe. On the front side of the cooling units 21 to 24 (back side in the illustration), pipes (not shown) for supplying the cooling water with heat absorbed by the cooling units 22, 23, to the cooling units 21, 24, are placed. In the pressurizing member 422 on the right side, holes H9, H10 to pass the pipes P1, P3 through are provided.

As the cooling units 22, 23, which are particularly likely to generate heat, are thus cooled preferentially, the cooling efficiency with the cooling units 20 can be enhanced.

Second Embodiment: Modification 3

FIG. 14 is an exploded perspective view showing Modification 3 of the power module according to this embodiment.

As shown in FIG. 14, the front wall 43 and the rear wall 44 made of an insulating material, and the pair of left and right insulating members 411, 421 described in the second embodiment, may be integrally molded.

As the power module M is configured in this way, the manufacturing cost can be reduced. Also, since the interface between the insulating member 411, and the front wall 43 and rear wall 44, and the interface between the insulating member 421, and the front wall 43 and the rear wall 44, described in the second embodiment are eliminated, the sites to be coated with the coating material are reduced and production efficiency can be enhanced.

Third Embodiment

A third embodiment is different from the second embodiment in that the metal member 30 and the pressurizing members 412, 422 described in the second embodiment are integrated to form a "metal member 30A" anew, and that spring members R are provided between the left and right inner wall surfaces of the metal member 30A and the multilayer body K. However, the other parts are similar to the second embodiment. Therefore, the different parts from the second embodiment are described and explanation of the same parts is omitted.

<Configuration of Power Module>

FIG. 15 is an exploded perspective view of the power module according to this embodiment, as looked down upon from the right rear. As shown in FIG. 15, the metal member 30 is in a U-shape as viewed from the front-rear direction and is formed in such a way as to be able to accommodate the multilayer body K. The metal member 30 is molded by a pultrusion method or an extrusion method, for example. Thus, the metal member 30A can be formed with high accuracy in such a way that the left wall and the right wall of the metal member 30A are parallel to each other.

FIG. 16 is an end view of the power module (corresponding to the line A-A shown in FIG. 1). The spring members R are leaf springs, for example. The two spring members R are situated between the left and right inner wall surfaces of the metal member 30A and the multilayer body K. In the state where the multilayer body K is placed sidelong on the bottom surface of the metal member 30A and where the spring members R are placed on both left and right sides of the multilayer body K, the multilayer body K is pressed (compressed) from left and right by the spring members R. Thus, the main body units 10 and the cooling units 20 can be brought in tight contact with each other and the cooling efficiency of the main body units 10 can be enhanced.

<Process of Manufacturing Power Module>

First, the multilayer body K and the spring members R are accommodated and positioned in the metal member 30A (positioning process), and the multilayer body K is pressed from left and right by the spring members R (pressing process). Next, the collector terminals 1i and the collector-connecting busbar 51 are connected together, and the emitter terminals 1j and the emitter-connecting busbar 52 are connected together (connecting process).

Subsequently, the front wall 43 and the rear wall 44 are fitted and fixed in the metal member 30A, which is in a U-shape in the front-rear direction, and the pair of insulating members 411, 421 with the busbars 51, 52 attached are fixed onto the metal member 30A. Next, after the interfaces between the metal member 30A, the front wall 43, the rear wall 44, and the insulating members 411, 421 are coated with a coating material (coating process), the insulating sealant G is poured (sealing process).

Advantageous Effects

According to this embodiment, since the left wall, the bottom wall and the right wall of the metal member 30A are integrally formed, the rigidity of the metal member 30A can be increased, compared with the case where these are separate members. Therefore, even though the spring members R are provided between the multilayer body K and the metal member 30A in the left-right direction, the left wall and the right wall of the metal member 30A are less likely to be deformed. Consequently, the pressing force can be made to act substantially uniformly in the planar direction on the left and right lateral sides of the multilayer body K, and the cooling efficiency of the main body units 10 can be enhanced.

Fourth Embodiment

A fourth embodiment is different from the first embodiment (see FIG. 5) in that the cooling units 20 and the metal member 30 are integrally molded to form a "heat dissipation member 60" and that a cooling water circulation member 70 is added. However, the other parts are similar to the first embodiment. Therefore, the different parts from the first embodiment are described and explanation of the same parts is omitted.

<Configuration of Power Module>

FIG. 17 is an end view of the power module according to this embodiment (corresponding to the line A-A shown in FIG. 1). The heat dissipation member 60 is made of a metal (for example, copper) and has a plate-like support 61 (metal member) which supports the casing W, and cooling units 62a to 62d extending upward from this support 61. The support 61 extends along a horizontal plane and is in a rectangular shape as viewed in a plan view. The left-right width of the support 61 is set in such a way that the parts near its both ends protrude from the left wall 41 and the right wall 42 in the state where the power module M is assembled. The support 61 is provided with a plurality of screw holes through which to insert screw members T.

Each of cooling units 62 (62a to 62d) is in the shape of a rectangular parallelepiped and is formed in such a way that the lateral surfaces (substantially entire surfaces) of the main body units 10 come in tight contact with the lateral surfaces of the cooling unit. The distance between the cooling units 62 next to each other in the left-right direction corresponds to the left-right width of the main body units 10. That is, the main body units 10 are accommodated between the cooling units 62 next to each other in the left-right direction, as shown in FIG. 17. The cooling unit 62a at the left end and the cooling unit 62d at the right end are provided with slits along the up-down and front-rear planar directions so that wedges F can be inserted there from above.

The heat dissipation member 60 is formed by a pultrusion method or an extrusion method, for example. As the heat dissipation member 60 is thus integrally formed, the thermal resistance of the cooling units 62 can be reduced. That is, the heat absorbed by the cooling units 62 is transferred more easily toward the support 61 and thermal conduction via the cooling units 62 progresses smoothly.

In this embodiment, since a flow path for allowing cooling water to flow need not be provided in the cooling units 62, the process of manufacturing the cooling units 62 can be simplified.

The cooling water circulation member 70 is in the shape of a rectangular parallelepiped which is thin in the up-down direction and has a plurality of (in FIG. 17, four) flow paths H11 formed inside along the front-rear direction. As cooling water is made to flow through these flow paths H11, the heat dissipated from the main body units 10 to the cooling units can be released to the outside. The cooling water circulation member 70 is placed in tight contact with the bottom surface of the support 61.

<Process of Manufacturing Power Module>

The heat dissipation member 60 is placed on the cooling water circulation member 70, and the heat dissipation member 60 is fixed to the metal member 30 with the screw members T (positioning process). As the screw members Tare thus screwed in, the heat dissipation member 60 can be easily positioned in the front-rear and left-right directions.

It is preferable that a thermally conductive sheet (not shown) such as grease or carbon sheet is provided between the heat dissipation member 60 and the cooling water circulation member 70. Thus, variations in dimension (variations in thickness) of the heat dissipation member 60 and the cooling water circulation member 70 can be absorbed by the thermally conductive sheet and thermal resistance can be reduced.

Next, the wedges F made of a metal are inserted in the slits provided in the cooling units 62, thus pressing the multilayer body K from left and right (pressing process). As the wedges F are thus inserted, the cooling units 62 are elastically deformed in such a way as to be expanded to left and right. Consequently, the multilayer body K made up of the cooling units 62 and the main body units 10 is pressed (compressed) in the left-right direction, and the main body units 10 and the cooling units 62 come in tight contact with each other. Therefore, the thermal resistance between the main body units 10 and the cooling units 62 can be reduced.

Next, the left wall 41 and the right wall 42 in which the busbars 51, 52 are placed are placed on both sides of the multilayer body K, and the front wall 43 (not shown) and the rear wall 44 (not shown) are also placed, thus electrically connecting the main body units 10 to the busbars 51, 52 (connecting process).

Next, after the interfaces between the support 61, the left wall 41, the right wall 42, the front wall 43 and the rear wall 44 are coated with a coating material (coating process), the insulating sealant G is poured (sealing process).

The positioning process with the cooling water circulation member 70 may be after the sealing process. This enables the power module M to be manufactured as a single unit and can improve productivity.

Advantageous Effects

According to this embodiment, since a flow path for cooling water need not be provided in the heat dissipation member 60, the heat dissipation member 60 can be formed easily. Also, as the heat dissipation member 60 is fixed to the cooling water circulation member 70 with the screw members T, the positioning process can be carried out more easily than in the first embodiment (see FIG. 5), where the jig (not shown) is used for positioning.

Also, as the wedges F are inserted in the slits provided in the cooling units 62a, 62d, the multilayer body K is pressed from left and right, bringing the main body units 10 and the cooling units 62 in tight contact with each other. Thus, compared with the case of using the fasteners Q (see FIG. 7) as in the first embodiment, the multilayer body K can be pressed with a simple configuration and therefore the production efficiency of the power module M can be enhanced.

Fifth Embodiment

A fifth embodiment is different from the fourth embodiment in that fins 63 are added to and integrally formed with the heat dissipation member 60 described in the fourth embodiment, thus forming a "heat dissipation member 60A" afresh. However, the other parts are similar to the fourth embodiment. Therefore, the different parts from the fourth embodiment are described and explanation of the same parts is omitted.

<Configuration of Power Module>

FIG. 18 is an end view of the power module according to this embodiment (corresponding to the line A-A shown in FIG. 1). The heat dissipation member 60A is made of a metal (for example, copper), and has the plate-like support 61 (metal member) extending along a horizontal plane, the cooling units 62a to 62d extending upward from the support 61, and the fins 63 extending downward from the support 61.

As in the fourth embodiment, the parts near both ends of the support 61 protrude from the left wall 41 and the right wall 42 and have a plurality of screw holes formed therein. The cooling units 62 (62a to 62d) are each in the shape of a rectangular parallelepiped and are arranged at a predetermined space (corresponding to the lateral width of the main body units 10) from the other cooling units 62 next to each one in the left-right direction. The cooling units 62a, 62d at both left and right ends are provided with slits in which the wedges F are inserted.

The plurality of fins 63 are thin plate-like metals extending along the front-rear and left-right directions. The heat generated in the main body units 10 is dissipated through heat exchange with the air via the air-cooling fins 63.

<Process of Manufacturing Power Module>

The main body units 10 are accommodated between the cooling units 62 next to each other in the left-right direction, and the wedges F are inserted in the slits provided in the cooling units 62 (positioning process, pressing process). Next, the left wall 41 and the right wall 42 in which the busbars 51, 52 are placed are placed on both sides of the multilayer body made up of the main body units 10 and the cooling units 62, and the front wall 43 (not shown) and the rear wall 44 (not shown) are also placed.

Next, after the casing (left wall 41, right wall 42, front wall 43, rear wall 44) is fixed to the support 61 with the screw members T, the main body units 10 and the busbars 51, 52 are electrically connected together (connecting process).

Next, after the interfaces between the support 61, the left wall 41, the right wall 42, the front wall 43 and the rear wall 44 are coated with a coating material (coating process), the insulating sealant G is poured (sealing process).

Advantageous Effects

According to this embodiment, since the support 61, the cooling units 62 and the air-cooling fins 63 are integrally formed as the heat dissipation member 60A, thermal resistance can be reduced and the main body units 10 can be efficiently cooled, compared with the case of joining the fins 63 to the support by caulking or with a brazing material. Also, since a flow path for allowing cooling water to flow need not be provided in the heat dissipation member 60A, the process of manufacturing the heat dissipation member 60A can be simplified.

Sixth Embodiment

A sixth embodiment is different from the first embodiment (see FIG. 4) in that the left wall 41 is divided into the insulating member 411 (see FIG. 19) and the pressurizing member 412 and that the right wall 42 is divided into the insulating member 421 and the pressurizing member 422, and in the configuration and arrangement of a metal member 30B. However, the other parts are similar to the first embodiment. Therefore, the different parts from the first embodiment are described and explanation of the same parts is omitted.

<Configuration of Power Module>

FIG. 19 is a perspective view of the power module according to this embodiment, as looked down upon from the right rear.

The power module M has the main body units 10, the cooling units 20, the metal member 30B which separates the main body units 10 and the cooling units 20 arranged alternately in the left-right direction (see FIGS. 21 and 22), and the pressurizing members 412, 422 which press the main body units 10 and the cooling units 20 from left and right.

FIG. 20 is an exploded perspective view of the power module, as looked down upon from the right rear.

Each of the cooling units 20 is in the shape of a rectangular parallelepiped and has a flow path formed therein for allowing cooling water to pass. The pressurizing members 412, 422 are made of a metal, for example, and are each in the shape of a rectangular parallelepiped with a substantially equal height to the cooling units 20.

The metal member 30B contains copper or aluminum with high thermal conductivity, for example, and has a thin plate-like plate part 31 and pockets 32 (32a, 32b, 32c) for accommodating the main body units 10. The plate part 31 is in a rectangular shape as viewed in a plan view. The pockets 32 are recesses formed corresponding to the outer shape (rectangular parallelepiped) of the main body units 10 and are recessed downward from the plate part 31. The distance between the pockets 32 next to each other in the left-right direction is substantially equal to the lateral width of the cooling unit 20.

It is preferable that a metal which has a high thermal conductivity and can be easily processed, such as copper, aluminum, or an alloy of these, for example, is used as the metal member 30B. The metal member 30B is formed by raising or bending, for example.

FIG. 21 is an end view taken along the line A-A shown in FIG. 19. As shown in FIG. 21, the metal member 30B is in a pleated shape as viewed in a cross-sectional view, and functions as a partition board separating the main body units 10 and the cooling units 20 from each other. Also, the cooling units 20 and the main body units 10 accommodated in the pockets 32 are arranged alternately in the left-right direction. For example, the cooling units 21, 22 arranged on both sides of the main body unit 11 can exchange heat with the main body unit 11 via the pocket 32a. That is, the metal member 30B, which is integrally formed, has the function of separating the main body units 10 and the cooling units 20 from each other in such a way as to enable heat exchange in the state where the main body units 10 and the cooling units 20 are arranged alternately.

Also, in the state where the main body units 10 and the cooling units 20 are arranged alternately and separated by the metal member 30B, the main body units 10 are exposed upward (to one side) from the metal member 30B, and the cooling units 20 are exposed downward (to the other side) from the metal member 30B. The shape of the metal member 30B is not limited to the shape shown in FIG. 20 or the like and may be a different shape (a shape with irregularities) having the above functions.

Also, the bottom surface of the plate part 31 is in contact with the top surfaces of the cooling units 20 and the pressurizing members 412, 422.

The insulating members 411, 421 shown in FIG. 20 are each in the shape of a rectangular parallelepiped that is thin in the left-right direction. The front wall 43 and the rear wall 44 are each in the shape of a rectangular parallelepiped that is thin in the front-rear direction. As the insulating members 411, 421, the front wall 43 and the rear wall 44 are fixed to each other, the casing W having the hole H2 which is rectangular as viewed in a plan view is formed. This casing W is fixed to the plate part 31 in the state where the busbars 51, 52 are placed therein.

<Process of Manufacturing Power Module>

First, the cooling units 20 are arranged at a predetermined space from each other in the left-right direction, and the pressurizing members 412, 422 are arranged on both sides of these and positioned with the use of a jig (not shown) (positioning process). At this time, the cooling units 20 next to each other in the left-right direction are spaced apart from each other by a distance substantially equal to the lateral width of the pocket 32 (outer shape).

Next, the metal member 30B is placed from above, using the pressurizing members 412, 422 as a reference at the time of positioning in the front-rear and left-right directions. Thus, the pocket 32a is fitted in between the cooling units 21, 22, the pocket 32b is fitted in between the cooling units 22, 23, and the pocket 32c is fitted in between the cooling units 23, 24 (see FIG. 21).

Next, the main body units 10 are placed in the respective pockets 32 from above, and the main body units 10 are accommodated in the pockets 32. Next, the fasteners Q (see FIG. 19) are placed to squeeze the pressurizing members 412, 422 from left and right (pressing process). Thus, the main body units 10 and the cooling units 20, arranged alternately in the state where the metal member 30B is arranged in-between, are pressed (compressed) from left and right.

Next, the casing W (see FIG. 20) made up of the insulating members 411, 421, the front wall 43 and the rear wall 44 in the state where the busbars 51, 52 are placed therein is placed on the plate part 31. In this state, the above casing W is supported by the pressurizing members 412, 422 via the thin plate-like metal member 30B.

Then, the above casing W, the plate part 31 and the pressurizing members 412, 422 are fixed. For example, these may be fixed with an adhesive or may be fixed with fasteners such as bolts. Consequently, a "box" opened upward is formed by the casing W and the metal member 30B.

Next, the collector-connecting busbar 51 and the collector terminals 1i are connected together, and the emitter-connecting busbar 52 and the emitter terminals 1j are connected together (connecting process). Subsequently, the interface between the casing W made up of the left and right insulating members 411, 421, the front wall 43 and the rear wall 44, and the plate part 31, is coated with a coating material (coating process).

Next, the "box" made up of the above casing W and the metal member 30B is filled with the insulating sealant G, thus sealing the main body units 10, the busbars 51, 52 and the like (sealing process).

Advantageous Effects

According to this embodiment, since the metal member 30B functioning as a partition board is installed, the cooling units 20 and the pressurizing members 412, 422 on one hand, and the main body units 10, the insulating members 411, 421, the front wall 43 and the rear wall 44 on the other, can be completely separated in the up-down direction. Therefore, the leakage of the insulating sealant G poured in the "box" made up of the casing W and the metal member 30B can be prevented.

Also, the metal member 30B according to this embodiment is in the shape of a thin plate (see FIG. 21) and therefore has a smaller volume than the metal member of the first embodiment (see FIG. 4) having the cooling water flow path (not shown) formed inside. Therefore, the power module M can be miniaturized.

Also, it suffices to apply the coating material only to the interfaces of the insulating members 411, 412, the front wall 43, the rear wall 44 and the metal member 30B forming the "box", and therefore the operability at the time of manufacturing can be enhanced, compared with the first embodiment.

Moreover, since there is no risk of the insulating sealant G leaking to the outside, the front wall 43 and the rear wall 44 need not be extended further below the metal member 30B shown in FIG. 20. That is, the cooling units 20 are in a completed open state in the front-rear direction. Therefore, the configuration of and the arrangement work for the cooling pipe (not shown) connected to the flow paths H1 in the cooling units 20 can be simplified and the operability at the time of manufacturing can be enhanced.

Also, it is no longer necessary to provide the pressurizing members 412, 422 with the holes H7, H8 to pass the pipes P1, P3 through, as shown in FIG. 12. Therefore, the sites to be coated can be reduced and the operability at the time of manufacturing can be enhanced.

Also, the metal member 30B is in a pleated shape as viewed in a side cross-sectional view, as shown in FIG. 21, and therefore has relatively low rigidity in the left-right direction. Therefore, when the pressurizing members 412, 422 are pressed from left and right by the fasteners Q, the metal member 30B is easily deformed with this.

Thus, the clearances between the inner wall surfaces of the pockets 32 and the main body units 10, and the clearances between the outer wall surfaces of the pockets 32 and the cooling units 20 are more easily absorbed by the metal member 30B. Consequently, the inner wall surfaces of the pockets 32 and the main body units 10 come in tight contact with each other, and the outer wall surfaces of the pockets 32 and the cooling units 20 come in tight contact with the other, thus enabling efficient heat exchange between the main body units 10 and the cooling units 20.

Also, by inserting a high-thermal-conductivity sheet (not shown) such as grease or carbon sheet between the pockets 32 and the main body units 10 and between the pockets 32 and the cooling units 20, as in the first embodiment, it is possible to reduce thermal resistance.

Sixth Embodiment: Modification 1

FIG. 22 is an end view showing Modification 1 of the power module according to this embodiment (corresponding to the line A-A shown in FIG. 19). In the example shown in FIG. 22, the pressurizing member 412 on the left side, the pressurizing member 422 on the right side and a bottom wall 45 are integrally formed in a U-shape as viewed in a cross-sectional view. Also, the spring member R (leaf spring) is arranged between the cooling unit 21 at the left end and the pressurizing member 412, and the spring member R is arranged between the cooling unit 24 at the right end and the pressurizing member 422.

In this embodiment, the fasteners Q (see FIG. 19) described in the sixth embodiment need not be placed.

As the pressurizing members 412, 422 and the bottom wall 45 are integrally molded as shown in FIG. 22, the rigidity of the pressurizing members 412, 422 can be increased. Therefore, in the case where the spring members R are placed as shown in FIG. 22, the pressing forces from left and right act substantially uniformly on the main body units 10 and the cooling units 20. Therefore, the cooling efficiency of the main body units 10 can be enhanced.

Sixth Embodiment: Modification 2

FIG. 23 is an end view showing Modification 2 of the power module according to this embodiment (corresponding to the line A-A shown in FIG. 19). As shown in FIG. 23, the pressurizing member 412 on the left side is in the shape of an inverted L as viewed from the front-rear direction, and has an extension 412a extended out to the left. A screw hole along the up-down direction is formed in this extension 412a. The same applies to the pressurizing member 422 on the right side as well.

Also, a screw hole is formed near both left and right ends of the metal member 30B, and screw holes to mesh with screw members T are formed in the left and right insulating members 411, 421 as well.

The front wall 43 (not shown), the rear wall 44 (not shown) and the left and right insulating members 411, 421 are integrally formed, thus forming a "casing" having a hole which is rectangular as viewed in a plan view. As shown in FIG. 23, as the screw members T are placed, the pressurizing members 412, 422, the metal member 30B and the above "casing" can be easily positioned and fixed. Also, since the fasteners Q (see FIG. 19) described in the sixth embodiment are no longer needed, the manufacturing cost of the power module M can be reduced.

Moreover, since the front wall 43, the rear wall 44 and the left and right insulating members 411, 421 are integrally formed, the sites to be coated are reduced, compared with the sixth embodiment. Therefore, the operability at the time of manufacturing can be enhanced.

Seventh Embodiment

A seventh embodiment is different from the sixth embodiment in that the edge of a metal member 30C is standing up and in the shape and arrangement of the busbars 51, 52. However, the other parts are similar to the sixth embodiment. Therefore, the different parts from the sixth embodiment are described and explanation of the same parts is omitted.

<Configuration of Power Module>

FIG. 24 is an exploded perspective view of the power module according to this embodiment, as looked down upon from the right rear. As shown in FIG. 24, the metal member 30C has the plate part 31 extending along a horizontal plane, the pockets 32 (32a, 32b, 32c) recessed downward from the plate part 31, and a standing part 33 standing upward from the edge of the plate part 31.

The standing part 33 is in the shape of a quadrilateral frame as viewed in a plan view. In the state where the casing W made up of the insulating members 411, 421, the front wall 43 and the rear wall 44 is placed on the metal member 30C, the standing part 33 surrounds the casing W. The inner wall surfaces of the standing part 33 in the shape of a quadrilateral frame are in close contact with the outer wall surfaces of the casing W.

FIG. 25 is an end view of the power module (corresponding to the line A-A shown in FIG. 19). The collector-connecting busbar 51 and the emitter-connecting busbar 52 are integrally formed with the insulating member 411 on the left side and are exposed from the top surface of this insulating member 411. In this embodiment, the front-rear width of the exposed part of the busbars 51, 52 is set in such a way as to secure an insulation distance in the air.

The insulating member 411 on the left side has a protrusion 411a extending in the front-rear direction and protruding upward. As the protrusion 411a is thus provided, a length along the wall surface, of the exposed part of the collector-connecting busbar 51 and the sealed part of the emitter-connecting busbar 52 (part filled with the insulating sealant G), is secured and the insulation property can be thus enhanced.

The process of manufacturing the power module M is similar to the sixth embodiment and therefore its explanation is omitted.

Advantageous Effects

According to this embodiment, as the collector-connecting busbar 51 and the emitter-connecting busbar 52 are exposed from the top surface of the insulating member 411 on the left side, it is possible to cope even in the case where it is better to draw out the busbars 51, 52 in parallel, in consideration of the connecting relation between a plurality of power modules M.

Also, compared with the sixth embodiment, there is no risk of the coating material running down due to the influence of gravity, when applying the coating material to the interface between the casing W made up of the insulating members 411, 421, the front wall 43 and the rear wall 44, and the metal member 30C. This is because the coating material applied to this interface enters into the gaps between the outer wall surfaces of the above casing W and the inner wall surfaces of the standing part 33. Therefore, the coating can be easily carried out and the operability at the time of manufacturing can be enhanced.

Seventh Embodiment: Modification 1

FIG. 26 is an end view showing Modification 1 of the power module according to this embodiment (corresponding to the line A-A shown in FIG. 19). As shown in FIG. 26, the height to which the standing part 33 of a metal member 30D stands up may be higher than the liquid surface of the insulating sealant G filling the "box" (see the distance L5 shown in FIG. 26). Although not illustrated in the end view of FIG. 26, with respect to the entirety (including the front and rear) of the standing part 33 in the shape of a quadrilateral frame standing up from the edge of the plate part 31 of the metal member 30D, the top end surface of the standing part 33 is higher than the liquid surface of the insulating sealant G.

As the metal member 30D is configured in this way, even if the insulating sealant G leaks out via the gap between the "casing" made up of the insulating members 411, 421, the front wall 43 and the rear wall 44, and the metal member 30D, there is no risk of the insulating sealant G rising above the height of the liquid surface of the insulating sealant G shown in FIG. 26. This is because, according to Pascal's principle, a force to equalize the height of the liquid surface of the insulating sealant G acts due to atmospheric pressure. In this way, according to the configuration shown in FIG. 26, the insulating sealant G can be securely prevented from leaking to the outside.

Seventh Embodiment: Modification 2

FIG. 27 is an end view showing Modification 2 of the power module according to this embodiment (corresponding to the line A-A shown in FIG. 19). As shown in FIG. 27, the pressurizing member 412 on the left side is in the shape of an inverted L as viewed from the front-rear direction, and a screw hole along the up-down direction is formed in an extension 412a extending out to the left. The same applies to the pressurizing member 422 on the right side. As shown in FIG. 27, by placing the screw members T, the pressurizing members 412, 422, the metal member 30D, and the casing (insulating members 411, 421, front wall 43, rear wall 44) can be easily positioned and fixed.

Eighth Embodiment

An eighth embodiment is different in that a heat sink 80 (see FIG. 28) is installed on the cooling units 20, compared with the seventh embodiment (Modification 2), where the cooling water is made to flow through the cooling units 20. However, the other parts are similar to the seventh embodiment (Modification 2). Therefore, the different parts from the seventh embodiment (Modification 2) are described and explanation of the same parts is omitted.

<Configuration of Power Module>

FIG. 28 is an end view of the power module according to this embodiment (corresponding to the line A-A shown in FIG. 19). The heat sink 80 is provided to dissipate the heat absorbed from the cooling units 20 into the air. The heat sink 80 contains a highly thermally conductive metal (for example, aluminum) and has bases 81 and fins 82. The respective bases 81 are plate-like members extending downward (to the other side) along planes in the front-rear and up-down directions and are joined to the bottom surfaces of the cooling units 20 by caulking or with a brazing material.

The fins 82 are placed on the above bases 81 and extend along horizontal planes in such a way as not to interfere with the other fins 82. As shown in FIG. 28, it is preferable that the fins 82 placed on the bases 81 next to each other in the left-right direction are arranged alternately in the up-down direction while partly overlapping with each other. Thus, the surface areas of the fins 82 can be increased and their heat exchange with air can be carried out efficiently.

If the amount of heat generated by the main body units 10 is large, a cooling heat pipe (not shown) may be inserted in the up-down direction or in the front-rear direction, instead of the heat sink 80.

Advantageous Effects

According to this embodiment, since a flow path for allowing cooling water to flow need not be provided in the cooling units 20, the process of manufacturing the cooling units 20 can be simplified. Also, as the multiple fins 82 are provided as shown in FIG. 28, a contact area can be secured between the fins 82 and the air and the heat transfer efficiency at the time of heat dissipation from the fins 82 into the air can be enhanced.

Other Modifications

The power module M according to the invention has been described above. However, the invention is not limited to the above individual embodiments and can be changed as appropriate.

For example, while the case where the power module M has the three main body units 10 is described in the individual embodiments, this is not limiting. That is, the number of the main body units 10 may be suitably changed according to, for example, the current-carrying capacity of the power module M, and the main body units 10 and the cooling units 20 may be alternately arranged to form the multilayer body K.

Also, while the case where the left wall 41 has the protrusions 41a, 41b (see FIG. 5) and where the right wall 42 has the protrusions 42a, 42b is described in the first embodiment, for example, each protrusion may be omitted. Even in this case, the multilayer body K, the left wall 41 and the right wall 42 can be positioned, using a jig (not shown).

Also, the above individual embodiments can be combined suitably. For example, the third embodiment (see FIG. 16) may be applied to the fourth embodiment (see FIG. 17). That is, the multilayer body K may be accommodated in the heat dissipation member 60, in which the cooling units 20 and the metal member 30 are integrally formed, and the spring members R may be placed there (see FIG. 16). This heat dissipation member 60 may be placed on the cooling water circulation member 70 (see FIG. 17). In this case, there is no need to provide the cooling units 20 with a flow path for allowing cooling water to flow, and therefore the configuration of the cooling units 20 can be simplified.

REFERENCE SIGNS LIST

M power module
10, 11, 12, 13 main body unit
1a power semiconductor element (semiconductor element)
1b control terminal
1e, 1h heat dissipation layer
1i collector terminal (power terminal)
1j emitter terminal (power terminal)
20, 21, 22, 23, 24, 62, 62a, 62b, 62c, 62d cooling unit
30, 30A, 30B, 30C, 30D, 40 metal member
31 plate part
32, 32a, 32b, 32c pocket
33 standing part
41 left wall (a pair of sidewalls, casing)
42 right wall (a pair of sidewalls, casing)
43 front wall (another sidewall, casing)
44 rear wall (another sidewall, casing)
412, 422 pressurizing member
411, 421 insulating member
51 collector-connecting busbar (busbar)
52 emitter-connecting busbar (busbar)
60, 60A heat dissipation member
61 support
63 fin
70 cooling water circulation member
80 heat sink
81 base
82 fin
K multilayer body
W casing
B box
H1 flow path
G insulating sealant

The invention claimed is:

1. A power module comprising:
one or more main body units, each of the body units respectively having a semiconductor element, a control terminal connected to the semiconductor element, a power terminal through which a current corresponding to an electrical signal to the control terminal flows, and a heat dissipation layer;
one or more cooling units disposed to exchange heat with the heat dissipation layer and cool the main body units;
a busbar connected to the power terminal of each of the main body units;
a casing in which at least a contact part with the busbar is insulating; and
a metal member which supports the casing;
wherein the metal member contacts the casing, thereby forming a box with one side opened,
at least the main body units and the busbar are disposed inside the box,
in each of the main body units, the control terminal and the power terminal are disposed to extend to the one side from the semiconductor element, and
an insulating sealant fills the inside of the box, thereby sealing the main body units and the busbar,
the metal member has one or more pockets which are recessed towards another side opposite the one side and which accommodate the main body units,
the cooling units and the main body units, accommodated in the pockets, are arranged alternately and separated by the metal member, and
the cooling units exchange heat with the main body units via the pockets.

2. The power module according to claim 1, wherein the main body units and the cooling units are arranged alternately in the state of being in contact with the pockets as a multilayer body, and the multilayer body is accommodated in the box.

3. The power module according to claim 2, wherein the casing includes:
an insulating member in which the busbar is placed; and
a pressurizing member disposed to sandwich and press the cooling units into contact with the pockets.

4. The power module according to claim 3, wherein the insulating members form a pair of sidewalls of the box and the insulating members are supported by the pressurizing member.

5. The power module according to claim 2, further comprising:
a cooling water circulation member having one or more flow paths configured to pass cooling water,
wherein the cooling units and the metal member are integrally formed as a heat dissipation member, and
wherein the cooling water circulation member is disposed in contact with the heat dissipation member.

6. The power module according to claim 2, further comprising:
a heat dissipation member made up of the cooling units, the metal member and one or more air cooling fins which are integrally formed,
wherein the air-cooling fins extend away from the one side.

7. The power module according to claim 1, wherein the metal member has a standing part which surrounds the casing, as viewed in a plan view, and stands up toward the one side.

8. The power module according to claim 7, wherein a top of the standing part is higher than a liquid surface of the insulating sealant filling the inside of the box.

9. The power module according to claim 1, further comprising:
a pressurizing member disposed to sandwich and press the cooling units into contact with the pockets from opposing sides.

10. The power module according to claim 1, wherein the cooling units have one or more flow paths configured to pass cooling water.

11. The power module according to claim 1, further comprising:
a heat sink disposed on the cooling units which dissipates heat absorbed from the cooling units into the air.

12. The power module according to claim 1, wherein the insulating sealant is a gel or a resin.

13. A power module comprising:
one or more body units, each including a semiconductor element, a control terminal connected to the semiconductor element, a power terminal through which a current corresponding to an electrical signal to the control terminal flows, and a heat dissipation layer;
one or more cooling units which are arranged alternately with the main body units and which cool the main body units; and
a metal member which is integrally formed and which includes one or more pockets separating each of the main body units and the cooling units from each other;
wherein the main body units are exposed to one side from the metal member, and
the cooling units are exposed to another side opposite to the one side from the metal member,
the pockets are each recessed towards the other side and accommodate the main body units therein,
the cooling units and the main body units, accommodated in the pockets, are arranged alternately and separated by the metal member, and
the cooling units exchange heat with the main body units via the pockets.

14. A method for manufacturing a power module, comprising:
positioning one or more main body units, each having a semiconductor element, a control terminal connected to the semiconductor element, a power terminal through which a current corresponding to an electrical signal to the control terminal flows, and a heat dissipation layer, from one side into one or more pockets of a metal member, and positioning one or more cooling units to be arranged alternately with the main body units accommodated in the pockets and separated from the main body units by the pockets;
connecting together a busbar and the power terminal of each of the main body units;
forming a box having a casing in contact with and supported by the metal member, where the box has one side thereof which is open, at least a contact part of the casing with the busbar is insulating, and at least the main body units and the busbar are disposed inside the box;
filling an inside of the box with an insulating sealant;
wherein the control terminal and the power terminal extend to the one side from the semiconductor element in each of the main body units, and
the pockets are recessed towards another side opposite to the one side,
the cooling units and the main body units, accommodated in the pockets, are arranged alternately and separated by the metal member, and
the cooling units exchange heat with the main body units via the pockets.

* * * * *